US006758199B2

(12) United States Patent
Masters et al.

(10) Patent No.: US 6,758,199 B2
(45) Date of Patent: Jul. 6, 2004

(54) TUNED POWER IGNITION SYSTEM

(75) Inventors: Brett Masters, Belmont, MA (US); Brian MacLachlan, Malden, MA (US); Gert Muller, Norwood, MA (US); Jaco Pretorius, Somerville, MA (US); Marthinus van Schoor, Medford, MA (US)

(73) Assignee: Mide Technology Corporation, Medford, MA (US)

( * ) Notice: Subject to any disclaimer, the term of this patent is extended or adjusted under 35 U.S.C. 154(b) by 71 days.

(21) Appl. No.: 10/117,751

(22) Filed: Apr. 5, 2002

(65) Prior Publication Data

US 2002/0170548 A1 Nov. 21, 2002

Related U.S. Application Data

(60) Provisional application No. 60/281,917, filed on Apr. 5, 2001.

(51) Int. Cl.[7] .................................................. F02P 3/12
(52) U.S. Cl. ........................ 123/620; 123/641; 123/642; 310/359; 315/209 PZ
(58) Field of Search ................................. 123/641, 642, 123/620, 640; 310/316.01, 359; 315/209 PZ

(56) References Cited

U.S. PATENT DOCUMENTS

| | | | | |
|---|---|---|---|---|
| 4,054,936 A | * | 10/1977 | Ansai et al. | 361/257 |
| 4,767,967 A | * | 8/1988 | Tanaka et al. | 315/209 PZ |
| 5,118,982 A | * | 6/1992 | Inoue et al. | 310/359 X |
| 5,341,061 A | * | 8/1994 | Zaitsu | 310/359 X |
| 5,715,801 A | * | 2/1998 | Murasawa et al. | 123/642 |
| 5,872,419 A | * | 2/1999 | Hall et al. | 310/359 |
| 6,114,797 A | * | 9/2000 | Bishop et al. | 310/318 |

FOREIGN PATENT DOCUMENTS

WO    WO 01/36816    * 5/2001

* cited by examiner

Primary Examiner—Tony M. Argenbright
(74) Attorney, Agent, or Firm—Choate, Hall & Stewart

(57) ABSTRACT

An ignition system employing a piezoelectric transformer having a drive side and an output side. The ignition system further includes circuit elements in electronic communication with the output side that tune output impedance in series with a breakdown gap to optimize power flow from the transformer to the breakdown gap after breakdown and a timing control circuit in electronic communication with the drive side that meters post-breakdown energy delivered to the breakdown gap by timing the duration of post-breakdown power flow.

28 Claims, 14 Drawing Sheets

TUNED POWER IGNITION SYSTEM

This application claims the priority of U.S. Provisional Application No. 60/281,917, filed Apr. 5, 2001, which is incorporated herein by reference. This application is also related to the commonly-owned U.S. patent application Ser. No. 10/117,568 entitled "Single Crystal Piezoelectric Transformer," by Masters and MacLachlan, filed on even date herewith, now U.S. Pat. No. 6,674,222.

FIELD OF THE INVENTION

This invention pertains to ignition circuits, and, more specifically, to an ignition circuit incorporating a piezoelectric transformer that improves the efficiency of a spark ignition system.

BACKGROUND OF THE INVENTION

Spark ignition systems are designed to generate high voltages and deliver energy at sufficient quantity and speed to ensure arc breakdown across a gap. Breakdown voltages depend on the application, e.g., internal combustion, gas turbine engines, energetic material initiation, etc. These voltages must be generated with a reasonable degree of certainty to attain accurate timing for the ensuing combustion process. The voltage and resulting energy must also be generated with a suitable margin to account for conditional changes from event to event that change the absolute breakdown voltage.

Spark ignition systems also deliver energy during and post breakdown to sustain combustion. Post-breakdown, the ignition system should provide enough energy to the ionized plasma to sustain the kinetics of local ignition. For many ignition systems, it is not sufficient to merely provide the energy (see Automotive Handbook, $2^{nd}$ edition, Robert Bosch GmbH, 1986). The quantity and duration of energy delivery, including energy delivery as a function of time, also influences combustion efficiency. Delivering post-breakdown energy too quickly, and thus at too high a current, results in electrode wear and unsustainable combustion, while delivering the energy too late simply heats the post-combustion products.

Many examples of ignition systems requiring control over both absolute timing and energy delivery profiles are found in internal combustion engines (Heywood, J. B., *Internal Combustion Engine Fundamentals*, McGraw-Hill, 1988; Bosch Automotive Handbook; G. F. W Ziegler, et al., "Influence of a Breakdown Ignition System on Performance and Emission Characteristics," SAE Technical Paper Series, No. 840992, 1984; C. F. Edwards and A. K. Oppenheim, "A comparative study of plasma ignition systems," SAE Technical Paper Series, No. 830479, 1983; Nakai, M., et al., "Stabilized Combustion in a Spark Ignited Engine through a Long Spark Duration," SAE Technical Paper Series, No. 850075, 1985; U.S. Pat. Nos. 3,838,671, 5,024,204, and 5,383,433). Typically, these systems must initiate combustion during startup conditions and run cleanly and efficiently through changes in a variety of conditions such as mixture ratios, intake pressures, and cylinder temperatures.

Small internal combustion (IC) engines, such as those found in lawn tractors and mowers, snow blowers, marine in/outboard motors, etc., pose unique requirements for engine startup and ensuing transition to operation speeds. Hand crank speeds and resulting cylinder pressures are low, requiring startup spark timing very close to top dead center (TDC) and spark durations on the order of several milliseconds. After start, the engine speed continues to increase, requiring increased spark advance and reduced spark energies for efficient running at operation speeds. It may not be cost efficient to accommodate both startup and steady operating conditions within the same ignition system. Further, larger IC engines depend on weighty and expensive "first time" starter systems. Typically, these involve electronic fuel pumps, starter motors and electronic ignition systems all working in unison to provide first time starts in the most adverse of conditions. Due to the conditions at start-up, e.g., cold oils, cold cylinders, cold catalytic converters, etc., excessive amounts of fuel are typically injected into the combustion chamber, only a fraction of which burns, resulting in high emissions. Recently, more attention has been paid to these start-up emissions because emissions during steady engine operations are decreasing.

Full electronic control of automotive ignition systems has enabled multidimensional timing maps as a function of speed, load, intake temperature, engine temperature and various other sensed variables (see, e.g., Bosch Automotive Handbook). These timing maps represent complex, empirically determined engine data for absolute timing of ignition systems. It is an object of the present invention to provide both timing and energy delivery control in electronic ignition. This extra degree of freedom for controlling engine performance (of all size engines) will reduce emissions and improve engine performance goals.

General aviation ignition systems require extremely reliable breakdown and energy delivery in order to guarantee ignition. Typical aircraft IC ignition systems, such as those sold commercially by Unison Industries, deliver a peak voltage of 23 kiloVolts (un-fouled, maximum required) and an energy discharge of 50 milliJoules. Some of these IC systems provide multiple sparks per sequence in order to ensure ignition.

In contrast, gas turbine ignition systems require adjustment of the firing rate for changing environmental conditions, while their absolute firing times are not as critical as in an IC engine. U.S. Pat. No. 5,852,381, issued Dec. 22, 1998, describes an exciter for generating voltages and energies necessary for turbine ignition. Typically, these systems fire once to twice a second and require high spark energy, on the order of Joules. Commercial exciter systems, such as that disclosed in the '381 patent, are controlled by regulatory electronics that are independent of the passive electrical properties of the igniter plug but are disposed in the high voltage path, making them susceptible to failure. Furthermore, current turbine engine exciter systems are based on captive discharge and thus generate high current rates that ultimately result in wear and electronic part fatigue.

In the defense industry, typical mono- and bi-propellant weapons fuels, such as hydrazine, provide unique challenges. They are generally highly toxic and have high transport, handling, storage, and other logistical costs. Suggested replacement fuels, such as hydrogen peroxide oxidants, generally have higher heat capacity and are harder to ignite. Enabling simple, lightweight ignition of these fuels could result in huge defense cost savings.

It is a further object of the present invention to provide a controllable system for non-ignition breakdown applications. Such applications include pest killers, electrostatic discharge weapons (Taser), safe and arm devices, and pyrotechnic initiators and actuators. In particular, through optimal power delivery, the present invention is intended to enable low cost, low power, rapid response pyrotechnic actuators such as air bag detonators.

SUMMARY OF THE INVENTION

The invention is a tuned power ignition (TPDI) system employing a piezoelectric transformer. The invention includes both means for tuning output electrical circuit impedance and specific timing control of the transformer. Together, these elements generate breakdown voltage and post-breakdown energy with deliberate quantity and accuracy. Parameters of the TPDI system are optimized with respect to the particular combustion system, e.g., an IC engine system, etc.

The timing control may be a function of a predetermination or calibration of system performance. Exemplary input signals for the timing control also include tuned output circuit impedance, predetermined external system calibration, and parameters measured by external system sensors. With tuned electrical output impedance, the power flow across the spark gap is optimized such that, when combined with accurate timing inputs, controlled timing of breakdown and duration of energy delivery is made possible. Through precise timing inputs, TPDI output power is converted to regulated energy delivery.

Typical ignition systems, for example, magnetically transformed and captive discharge, provide control over timing of breakdown voltage and limited quantities of post-breakdown energy. In contrast, TPDI provides a tool for controlling both absolute timing of breakdown and relative timing and quantity of the post-breakdown energy.

TPDI can be also used as the sole ignition system for IC engines of all sizes. It can also be used as a starter system for IC engines, either as a simple parallel add-on or a means for reducing the size, weight and cost of the starter motor. TPDI has utility as an initiator for energetic materials commonly used in detonators and pyrotechnic actuators. The system may also be exploited in starters and ignition systems for general and commercial aviation industries. In addition, the system may be incorporated into pest killers, electrostatic discharge weapons (Taser), and safe and arm devices.

In one aspect, the invention is an ignition system. The ignition system includes a piezoelectric transformer having a drive side, an output side, and a piezoelectric element circuit elements in electronic communication with the output side that tune output impedance in series with a breakdown gap to optimize power flow from the transformer to the breakdown gap after breakdown, and a timing control circuit in electronic communication with the drive side that meters post-breakdown energy delivered to the breakdown gap by timing the duration of post-breakdown power flow. The system additionally includes electronic feedback control, feed forward control, or both. These optimize output performance as the resonance of the transformer changes. The feedback control may receive a signal from the piezoelectric element, respond to an impedance in series electronic communication with the output side of the transformer, or both. The piezoelectric transformer may be a multi-layer Rosen type transformer, or a multi-layer thickness-extensional mode type transformer. The circuit elements may include a resistor, an inductor, a capacitor, or any combination of these.

The ignition system may further include sensor inputs that provide data for the timing circuit to determine the absolute timing and length of a timing pulse. The timing pulse and the tuned impedance determine the net energy and power delivery to the breakdown gap post-breakdown. The sensor inputs may measure one or more of output voltage, output power delivered, revolutions per minute, torque load, throttle position, pressure intake temperature, exhaust temperature or composition, intake composition, fuel consumption, humidity, catalytic converter or cylinder wall temperature, a temperature distribution across a turbine blade, spark discharge current, combustion performance, drive side voltage, and external control computer outputs. The sensor inputs may also measure chemical species, for example, oxygen, carbon monoxide, and carbon dioxide.

The ignition system may be used in addition to a pre-existing ignition system to optimize breakdown timing and post-breakdown energy delivery during pre-determined operating conditions. For example, the ignition system may be used during start up. Alternatively, the pre-existing ignition system may break down gap, and the ignition system may regulate the post-breakdown energy discharge.

The timing control circuit may provide an output signal to one or more of a transformer drive side amplifier, an oscillation generator in electronic communication with the drive side, and the feedback control. The timing control and the feedback and/or feed forward control may be combined in an integrated circuit. The output signal may be generated in response to parameters measured during operation of the ignition system. The timing control circuit may compare the parameters to a pre-determined reference value. The output signal may be a function of a plurality of measurements of the parameters. The output signal may be generated independently of the parameters. In addition, the timing control circuit may generate an output signal as a general waveform pulse having multiple control levels, a series of relatively timed single control level pulses, or both.

The transformer drive electronics may operate around a bias voltage to lower cycle by cycle resonant frequency variations and minimize material hysteresis. The piezoelectric transformer may include a single crystal piezoelectric element. The ignition system may include a plurality of piezoelectric transformers each having output rectification diodes that are adapted and constructed to be in electrical communication with a single capacitor that provides a charge to the breakdown gap.

In another aspect, the invention is a device having a combustion engine that has an igniter. The igniter has a primary ignition system and a secondary ignition system. The primary ignition system includes a power source and a capacitor that is charged by a power source. The secondary ignition system includes a piezoelectric transformer, circuit elements that tune the transformer output impedance in series with a breakdown gap, and a timing control circuit that meters post-breakdown energy delivered to the breakdown gap. The secondary system also includes an electronic feedback control, feed forward control, or both.

In another aspect, the invention is an ignition system including a piezoelectric transformer having a drive side, an output side, and a piezoelectric element, means for tuning an output impedance of the transformer in series with a breakdown gap, and means for metering post-breakdown energy delivered to the breakdown gap. The means for tuning optimize power flow from the transformer to the breakdown gap after breakdown. They may include a resistor, an inductor, a capacitor, or any combination of these in series electronic communication with the breakdown gap. The system further includes means for optimizing output performance of the transformer as a resonance condition of the transformer changes. The means for optimizing may include electronic feedback control, feed forward control, or both. These controls respond to an impedance in series electronic communication with the output side of the transformer.

BRIEF DESCRIPTION OF THE DRAWING

The invention is described with reference to the several figures of the drawing, in which.

DETAILED DESCRIPTION

Introduction

Piezoelectric Transformers

Figure 1:
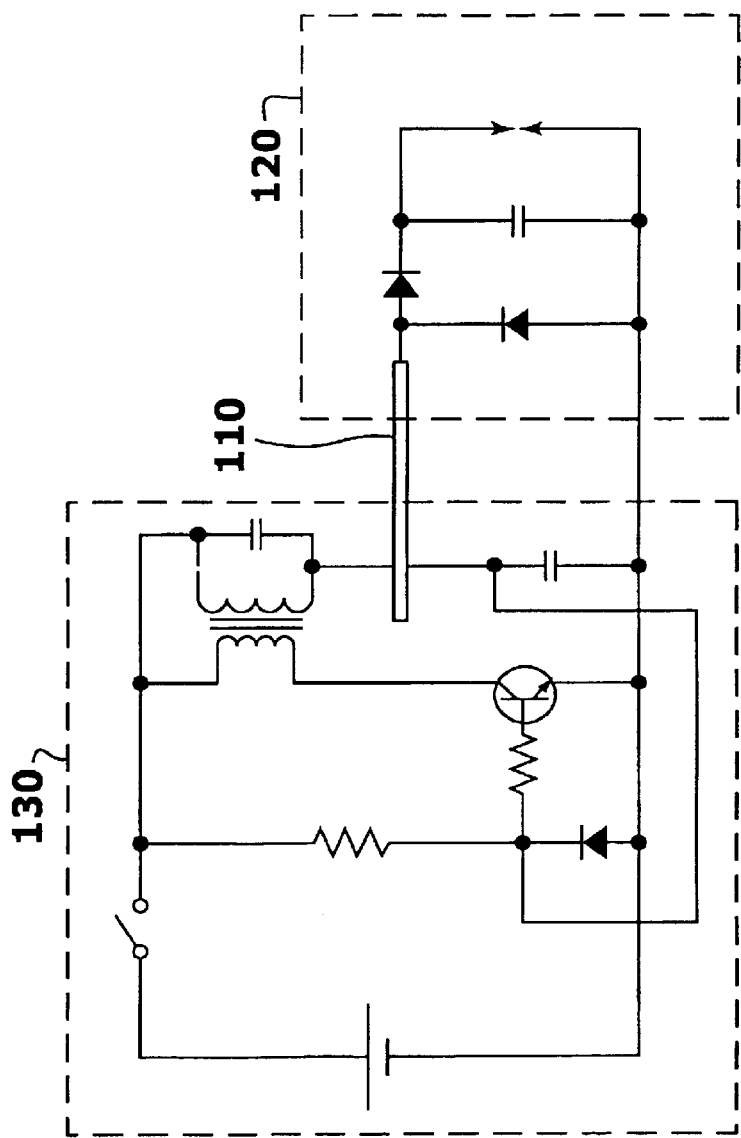
FIG. 1 illustrates a prior art ignition circuit where a Rosen type transformer element is excited by a "self oscillation" circuit.
Figure 2:
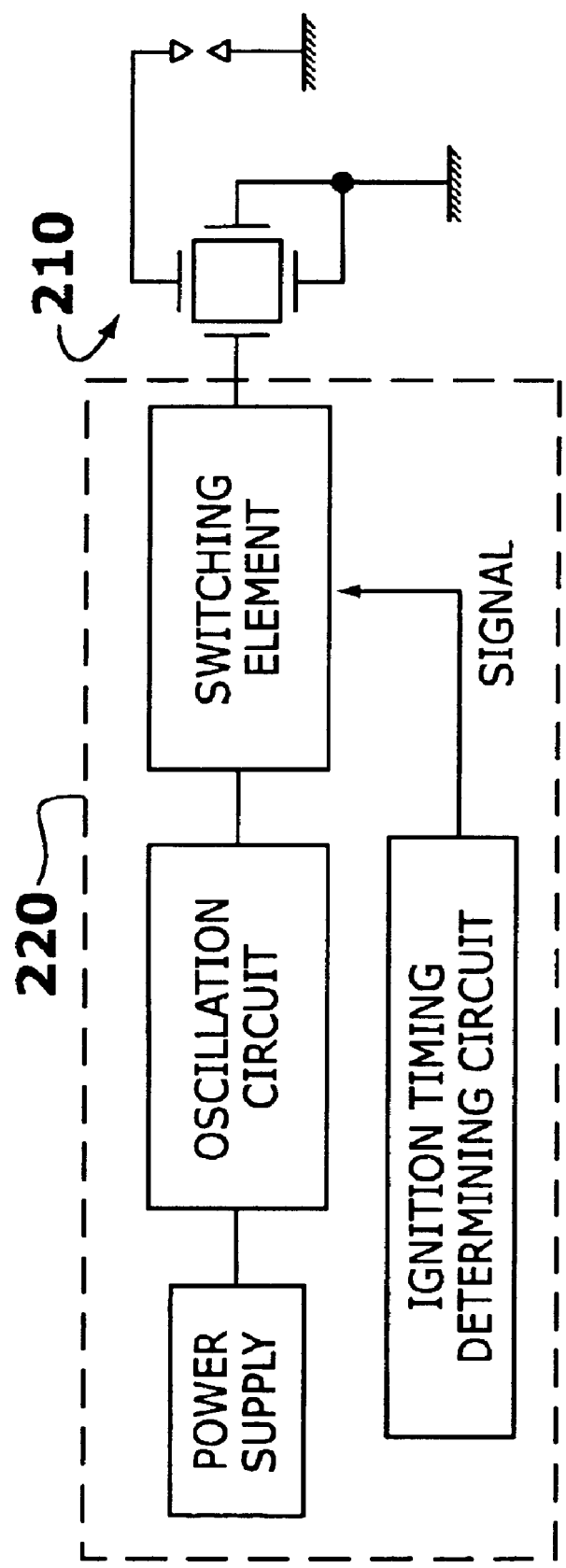
FIG. 2 illustrates a prior art ignition circuit where an uncontrolled transformer element is driven by a switching element without feedback and the output used to directly discharge in an unmetered fashion across a gap.

C. A. Rosen, ("Ceramic Transformers and Filters", Proceedings 1956 Electronic Components Symposium, pp. 205–211, 1956; Electronics Letters Mar. 31, 1988. Vol. 24, No. 7, pp. 444 to 445) discloses a piezoelectric device for use as a voltage transformer (FIG. 1). The principal of operation of the transformer is to excite an appropriately electroded piezoelectric ceramic structure at near resonant frequencies such that, through electromechanical coupling, voltage gain or attenuation can be achieved by accessing a secondary electrode(s). The system charges a capacitor, that, when charged to an appropriate level, discharges in an unregulated fashion across a gap. The piezoelectric transformer exhibits natural mechanical isolation, high throughput power density, low electromagnetic signature. Such devices should be coupled with electronic control systems such as "self excitation" or "feedback control" electronics to ease operation near resonance.

U.S. Pat. No. 5,341,061, issued Aug. 23, 1994, discloses use of the thickness mode vibration piezoelectric transformer disclosed in U.S. Pat. No. 5,118,982, issued Jun. 2, 1982, as a DC to DC converter. The transformer includes multiple alternating layers of electrode and piezoelectric material and is operated in a thickness extensional vibration mode. The feedback circuit regulates the pulse width modulation (PWM) drive of the input circuit. This achieves the desired output voltage reduction but does not condition the power transfer from the transformer under fast transient conditions, such as those realized during breakdown.

U.S. Pat. No. 5,872,419, issued Feb. 16, 1999, discloses a multi-layer piezoelectric transformer with feedback from an isolated sensor. The isolated feedback sensor enables the transformer to operate without generating spurious vibrations that lower overall device efficacy.

U.S. Pat. No. 4,054,936, issued Oct. 18, 1977, discloses a breakdown device utilizing a Rosen-type transformer driven by a self-oscillation circuit. The output is rectified into a capacitor. The capacitor is not sufficient to regulate spark gap voltage, and additional control circuitry should be used where accurate timing of breakdown or metering of post-breakdown energy is desired.

U.S. Pat. No. 4,767,967, issued Aug. 30, 1988, discloses piezoelectric elements used for high voltage generation for breakdown ignition. Generally, the disclosed piezo elements are operating in series with the breakdown gap and are not controlled to operate near resonance, at which their voltage and energy output capabilities would be maximized. The system as a whole uses no output related feedback to maintain device performance and does not condition the output.

U.S. Pat. No. 5,715,801, issued Feb. 10, 1998, discloses an internal combustion engine ignition system that utilizes a transformer for voltage gain. The disclosed system does not utilize regulatory elements on the high voltage output that would allow controllable conditioning of output energy delivered during breakdown.

U.S. Pat. No. 6,114,797, issued Sep. 5, 2000, the entire contents of which are incorporated by reference herein, discloses a central transformer device that combines a soft and hard piezoelectric material to yield a so-called high deformation piezoelectric (HDP) transformer. The device employs two piezoelectric disks which sandwich an electrode. A second electrode is disposed on one end of the stack to make a piezo 1-electrode 1-piezo 2-electrode 2 stack. The two piezoelectric elements are polarized perpendicular to the longitudinal plane of the stack. Piezo 1 drives piezo 2, which generates a voltage between electrodes 1 and 2. The device's net voltage gains are low, in the range of 40, requiring bulky input amplification inductors. Also, the soft piezoelectric material used for the drive side of the HDP provides a resistive, wide band resonance that is difficult to track. The transformer resonance moves significantly as the device heats, due to its soft internal inefficiencies resulting from both mechanical loss, or dissipation, and electrical, or dissipative dielectric, loss. The disclosure does not address output power conditioning of the discharged output.

Ignition Systems

U.S. Pat. No. 3,838,671, issued Oct. 1, 1974, teaches a capacitive discharge system whereby the capacitor is charged by a primary pole passing a wound magnetic core yoke. An additional pair of windings determines the firing of an Silicon Controlled Rectifier (SCR). The SCR firing discharges the capacitor through a primary winding. A secondary winding then realizes a high potential through induction. The timing is varied for low cranking speeds (300–400 RPM, minimum of 150 RPM) through speeds above idle (typically greater than 1500 RPM). A circuit is designed to provide an advancing timing shift in the range from 800 RPM to 1000 RPM.

U.S. Pat. No. 5,024,204, issued Jun. 18, 1991, discloses a continuously advancing capacitive discharge ignition system for small internal combustion engines. Both negative and positive half cycles of the control winding output signal are used for the continuous timing advance. A capacitor is charged by a magnet passing a charge winding. A magnetically independent winding, the control winding, regulates the phasing of a SCR discharge of the capacitor. The discharge is gained through a magnetic transformer, resulting in timed spark across a breakdown gap. This patent teaches the importance of absolute spark timing and the need for variable timing as a function of RPM but does not disclose the importance of controlled energy discharge.

U.S. Pat. No. 5,383,433, issued Jan. 24, 1995, discloses a micro-processor controlled inductive ignition system that uses a magneto-inductive ignition circuit at engine starting speeds and a microprocessor-controlled ignition circuit at engine running speeds. The patent teaches the use of a microprocessor to control inductive charge and discharge after a traditional magneto-inductive method has been used to overcome potential startup problems such as low battery power.

U.S. Pat. No. 5,852,381, issued Dec. 22, 1998, discloses an energetic spark ignition exciter circuit where energy is stored in a capacitor, and switched to the igniter plug using a novel thyristor switching device. The output energy is controlled by pulsing the output using solid-state high voltage switches. The controlling electronics are inherently un-isolated and subject to high current output rates and thus wear, as is typical for captive discharge systems.

Control of Power Delivery and Timing

Figure 3A:
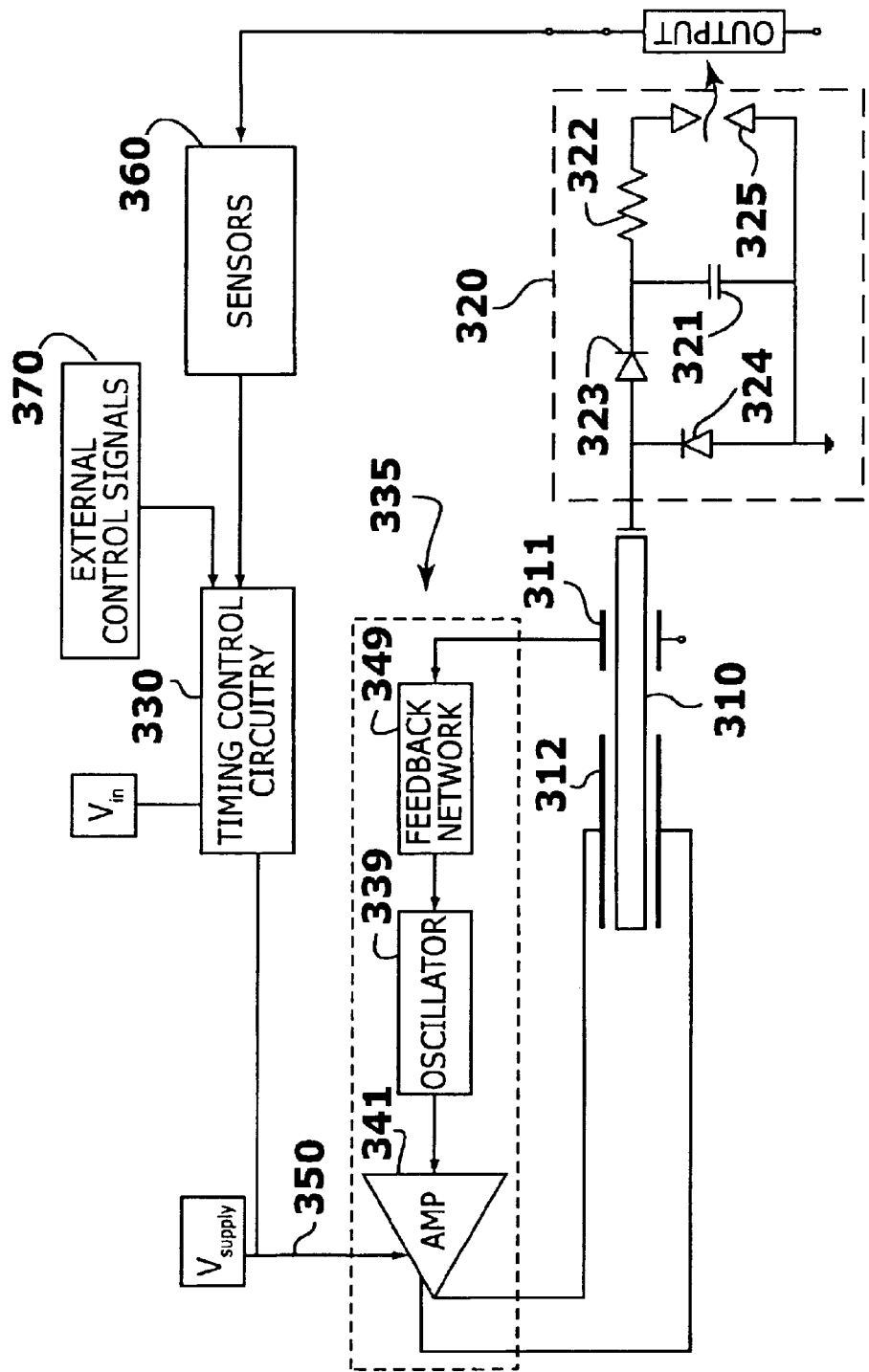
FIG. 3A illustrates a tuned power ignition (TPDI) system according to an embodiment of the invention.

A TPDI system according to one embodiment of the present invention is shown in FIG. 3A. FIG. 3A shows a transformer device 310 coupled with an output conditioning circuit 320, timing control circuitry 330, and drive oscillation circuitry 335. The combination of the output conditioning circuit 320 and the timing circuitry 330 controls the ignition system behavior by controlling the piezoelectric transformer device 310 through predetermined encoding or through tuned, or programmed, response to externally measured inputs. Control of the transformer 310 may be provided by separate electrode feedback 311, as disclosed in the '419 patent. Also shown in the figure is feed forward signal 350 for the transformer device 310. External control signals 370 may simply serve as an on/off switch or integrate the TPDI system with other electronics in whatever device (e.g., automobile, etc.) the TPDI is installed in.

The transformer power output is conditioned through a circuit 320 having a charge capacitor 321 and a series impedance provided by resistor 322, an inductor, a series capacitor or some combination of these (see FIG. 9). The output conditioning circuit 320 is rectified by diodes 323 and 324. At sufficiently high voltages, the output breaks down the gap 325. The resulting response, e.g., combustion, may in turn be detected by sensors 360 and converted to an input signal for the timing circuitry 330. Drive oscillation circuitry 335 includes feedback network 340, oscillator 339, and power amplifier 341. A low power signal from oscillator 339 is used to regulate, or "gate," the power flow from $V_{supply}$. In an alternative embodiment, $V_{supply}$ may be regulated directly by the timing control circuitry 330 (see FIG. 3C). The power amplifier 341 is specialized to drive a capacitive output load such as transformer 310.

The speed of the various controls, or high sensitivity of the device to changing output conditions, determines overall TPDI system performance. Poor ignition will result if timing control circuitry 330 or feedback network 340 "lose track" of the transformer resonance during breakdown and subsequent energy delivery because the device will no longer provide reliable charging.

Figure 3B:
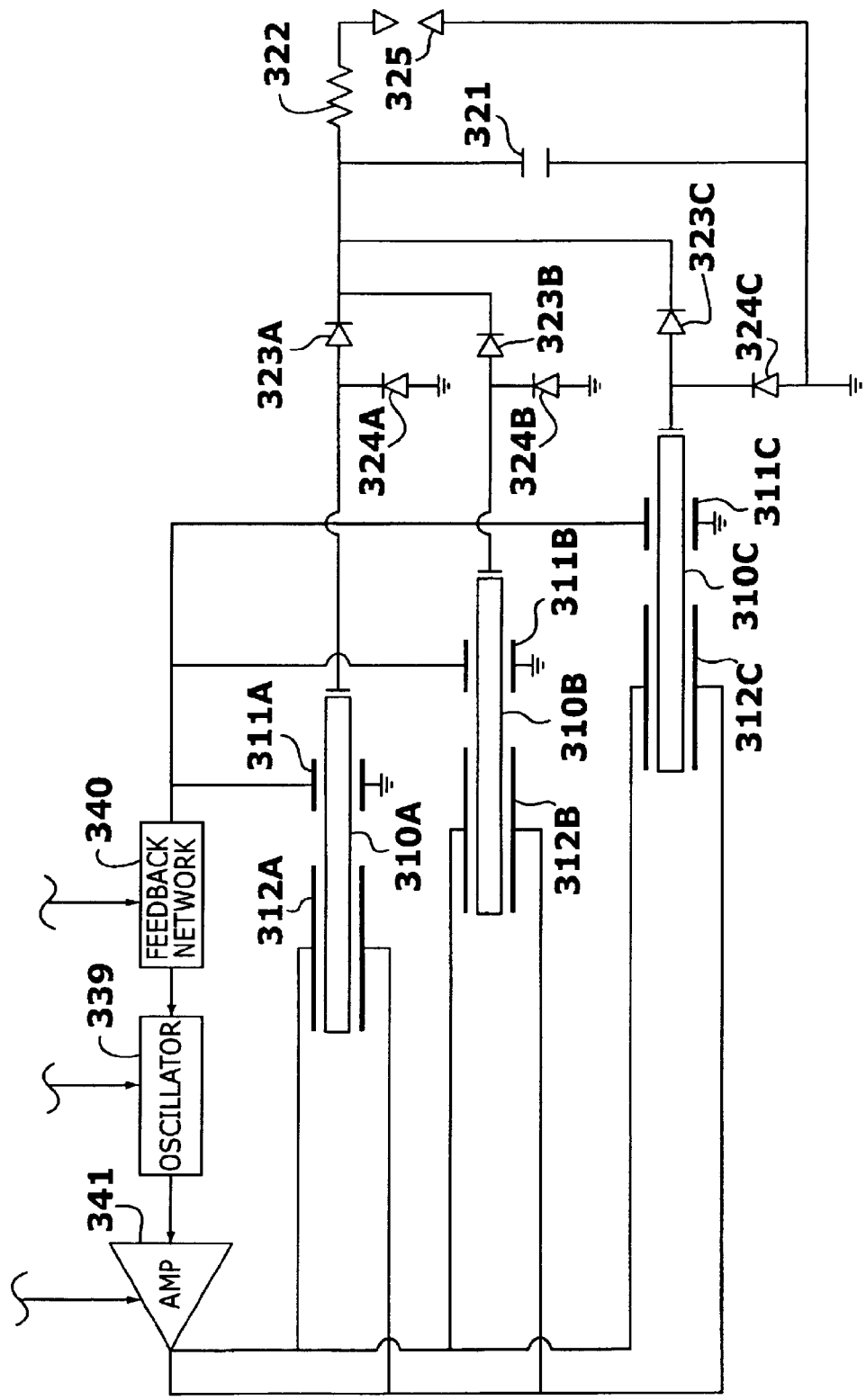
FIG. 3B illustrates an alternative embodiment of the invention employing several transformers.

One skilled in the art will recognize that a variety of piezoelectric transformers may be employed with this invention. FIG. 3A depicts a single layer monolithic transformer. Transformers such as the thickness-extensional mode vibration piezoelectric transformer disclosed in U.S. Pat. No. 5,118,982, the contents of which are incorporated herein by reference, may also be used. The primary requirements for a transformer construction for the TPDI system are high voltage gain, minimal response delay and high power throughput when underloaded. A particular construction that satisfies these requirements is the multi-layer device disclosed in U.S. Pat. No. 5,872,419, the contents of which are incorporated herein by reference. The use of thin multiple layers enables high voltage gains while keeping the device length short, minimizing device delays due to the speed of sound within the material. Further stacking of the multi-layers to increase the transformer cross-section increases the transformer power throughput capability. For a given breakdown voltage, improved power capability results in faster delivery of the necessary energy. The breakdown voltage and energy requirements in each application will dictate the best transformer geometry. Alternatively or in addition, several transformers may be used, as shown in FIG. 3B.

Figure 3C:
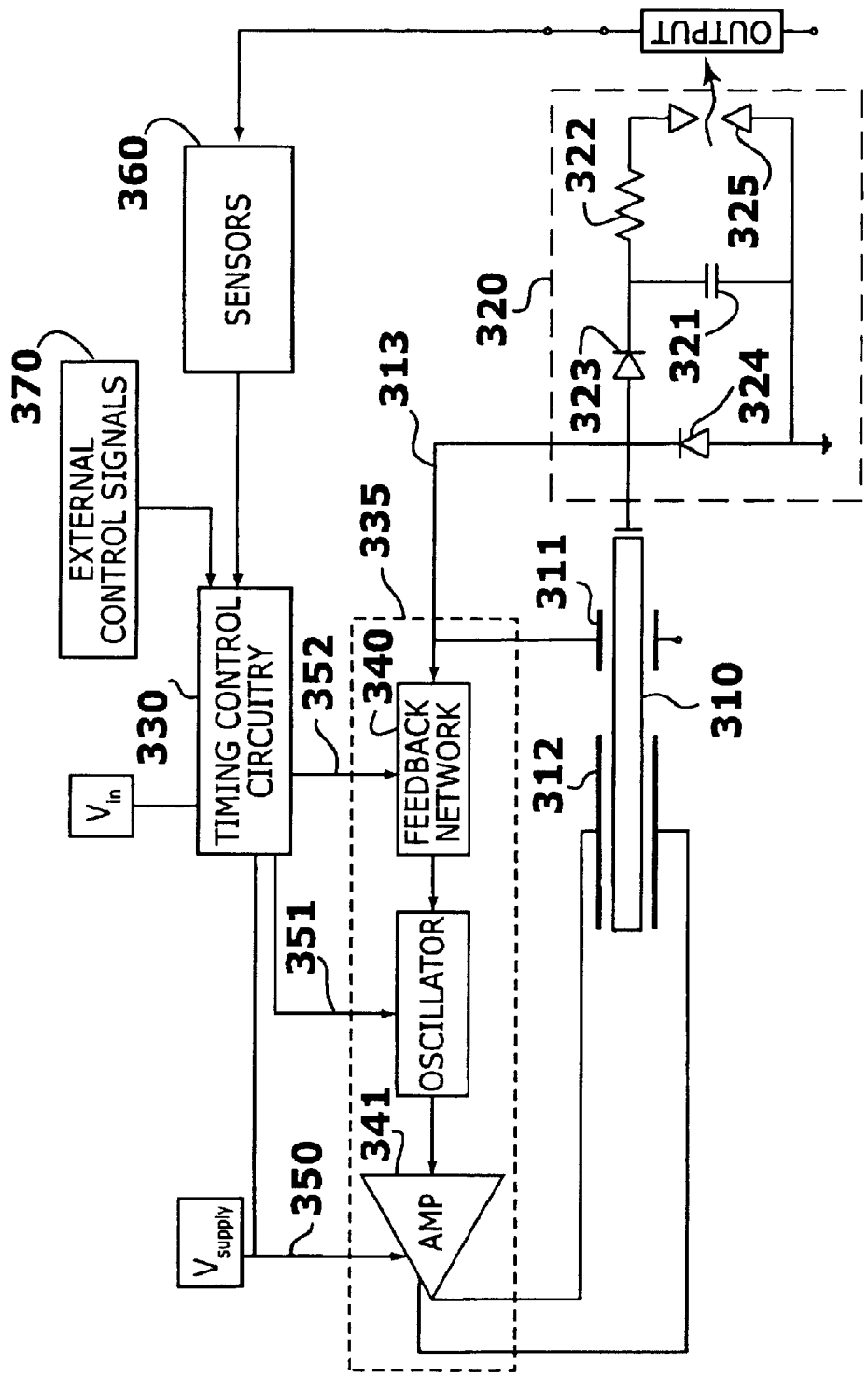
FIG. 3C illustrates an alternative embodiment of the invention employing additional feed forward and feedback signals.

An alternative embodiment of the TPDI employs output feedback 313 either in addition or as alternative to electrode feedback 311 (FIG. 3C). Some prior art devices transmit this direct measure of the transformer output to the feedback network to generate "self oscillations" at a frequency for which the phases at the transformer input and output are the same. However, "self oscillations" are not desirable in the present invention because they result in inconsistent delays and impede control of the absolute timing of a discharge device.

Many prior art devices rely on control of "free resonance" of the transformer. However, for many applications, transformer mounting is necessary for reliable device performance in an external vibration environment. For example, IC engines and gas turbine engines have moderate vibration environments in which the ignition system must sustain performance. Mounting, i.e., mechanically constraining, the transformer has a deleterious effect on resonance frequency and the Q achievable at this frequency, thus reducing device efficiency. U.S. Pat. No. 4,767,967 tries to overcome this dilemma by suggesting an applied pre-load and stacking of several devices. However, we have demonstrated that the resulting disadvantageous contact conditions and extraneous energy leakage paths reduce performance (data not shown). Further, slow feedback control of a "free resonance" condition is also inappropriate in this invention because the actual device resonance shifts abruptly upon changing electrical load conditions during each cycle of excitation due to the output rectification, storage and discharge. Thus, "free resonance" is not an accurate description because this resonance condition actually varies within a period of a transformer response cycle.

In the embodiment shown in FIG. 3C, the invention includes feed forward commands 351 and 352 that are fed forward from external timing control circuitry 330. Feed forward signals 351 and 352 are optional commands from outside of the feedback loop that can schedule the oscillatory drive signal in a pre-calculated fashion to compensate for changes in transformer resonance with changing output electrical conditions. For example, if the resonance frequency is known to shift on a cycle by cycle basis, the feed forward commands 350, 351, and 352 sweep the input frequency appropriately to match the changing conditions that the electrically loaded transformer 310 experiences within a cycle by cycle time frame. The prescribed signal may be completely pre-calculated, the result of relatively long time scale computations based on sensing of slowly changing environmental variables such as temperature, or some combination of both. The feed forward commands 350, 351, and 352 may be used in conjunction with the output feedback signal 313 and/or electrode feedback 311 or independently to drive the transformer effectively.

Figure 3D:
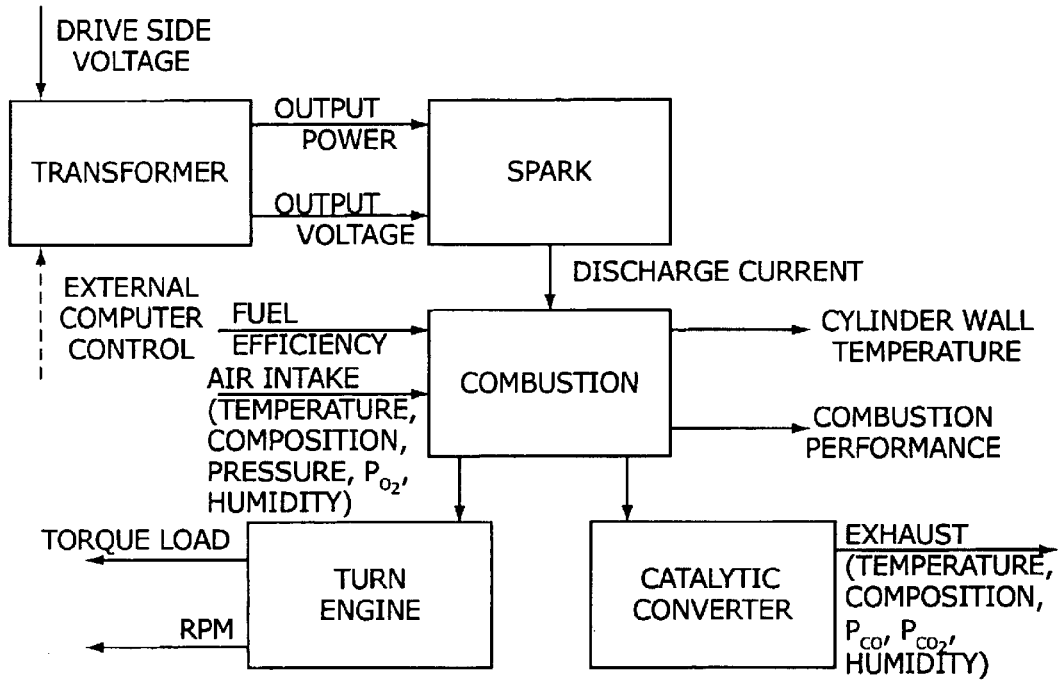
FIG. 3D illustrates a variety of operating parameters in an internal combustion engine that detected by sensors connected to an ignition system according to an embodiment of the invention.
Figure 3E:
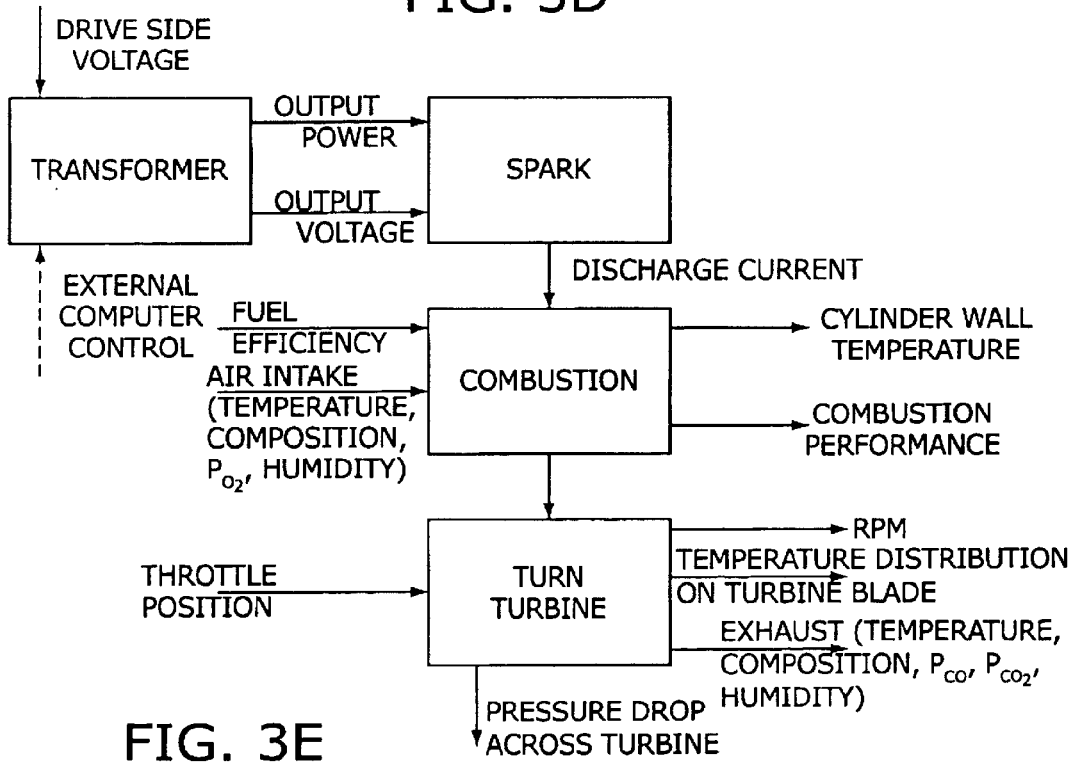
FIG. 3E illustrates a variety of operating parameters in a gas turbine engine that may be detected by sensors connected to an ignition system according to an embodiment of the invention.

In one embodiment, the invention employs timing control circuitry 330 in conjunction with internal transformer control loops. Sensors 360 measure variables such as revolutions per minute (RPM) and torque load (for an IC engine) or pressure, temperature and combustion species (for a gas turbine). FIGS. 3D and 3E are block diagrams of an ICE and a gas turbine engine, respectively, illustrating the various parameters that may be measured during operation. These include the drive side voltage and output power on voltage of the transformer, spark discharge current, fuel consumption, air composition (for example, humidity, oxygen concentration, etc.), temperature, and humidity, and combustion performance. For an ICE, the sensors 360 may measure cylinder wall temperature, engine torque load, revolutions per minute, catalytic converter temperature, exhaust composition (for example, carbon monoxide, carbon dioxide, and humidity), and control signals from other computers controlling the engine, for example, computers that control the fuel/air ratio. For a gas turbine engine, the sensors 360 may measure revolutions per minute, a temperature distribution across one or more turbine blades, a pressure drop across the turbine blade, and exhaust composition, temperature, and humidity. One skilled in the art will realize that there are other performance variables that may also be measured. These data are fed back to the timing control circuitry 330.

The timing control circuit 330 may compare the data to predetermined reference values. For example, a target temperature or power output may be programmed into the timing control circuitry, which may alter the transformer timing or power to achieve the desired target. The timing circuitry 330 provides a timing pulse that engages the transformer over a period of time that in turn depends on the known transformer output power flow. This circuitry may also provide fast feed forward commands and excitations based on slowly varying changes in measured or mathematically inferred operational conditions.

Thus, there are two types of feedback within the TPDI system providing data that allow the timing control circuitry 330 and drive oscillation circuitry 335 to optimize timing and power delivery. Electrode feedback 311 and/or output feedback 313 deliver a signal directly to feedback network 340. Sensors 360 deliver a signal to timing control circuitry 330. Of course, the timing circuitry 330 may perform its function based only on a predetermined tuning or program registered during calibration or initiation procedures without the use of external sensors.

Simple, low cost preconditioned sensors, such as Hall effect sensors, are typically used for measurement of engine RPM. However, preexisting equipment sensors may also be used to control the timing of the device. Whether the TPDI is used as an "add on" starter or solely as an energy delivery device, a preexisting magneto pulse or spark discharge from an in situ ignition system may be used (FIG. 4). In such an embodiment, the TPDI may be timed to deliver both breakdown and post-breakdown energy or solely post-breakdown energy as a supplement to an existing spark system. An initial "boot up" or "ready" signal is provided via a push button or other such device. The TPDI may then deliver 10's to 100's of timed energy pulses, as is needed to ensure startup or idle, based on the timing measurement from the existing ignition system or an auxiliary sensor. By using the sensors to infer conditions such as low RPM startup and idle and loaded operation, the device can be turned off or on depending on the operating conditions.

Figure 4A:
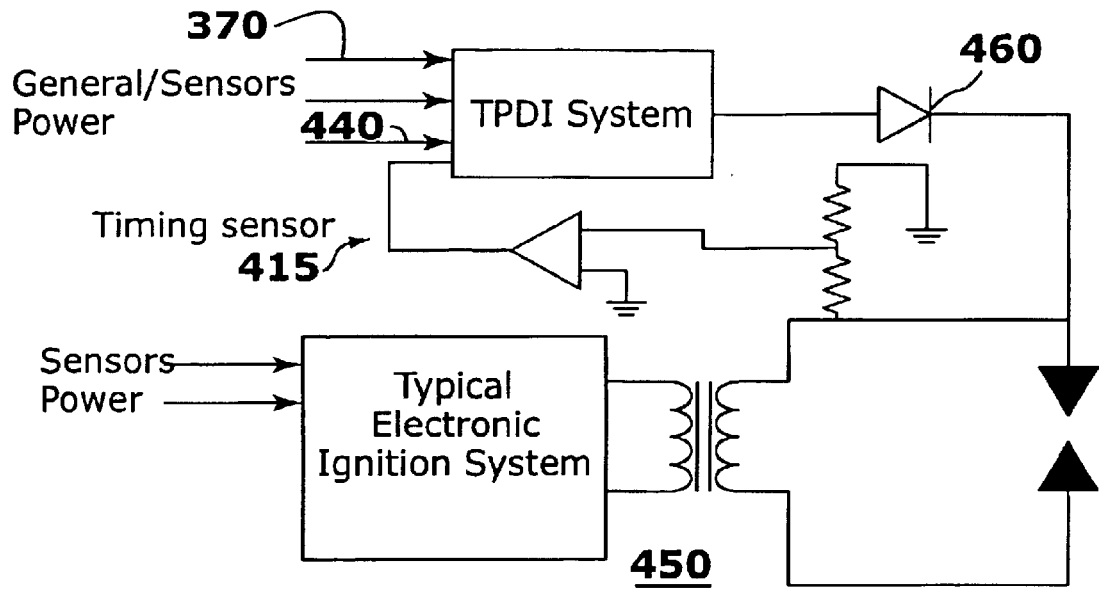
FIGS. 4A and 4B illustrate devices in which an ignition system according to an embodiment of the invention may be combined with existing electronically timed systems using (A) a timing sensor or (B) a pick-up sensor for feedback.
Figure 4B:
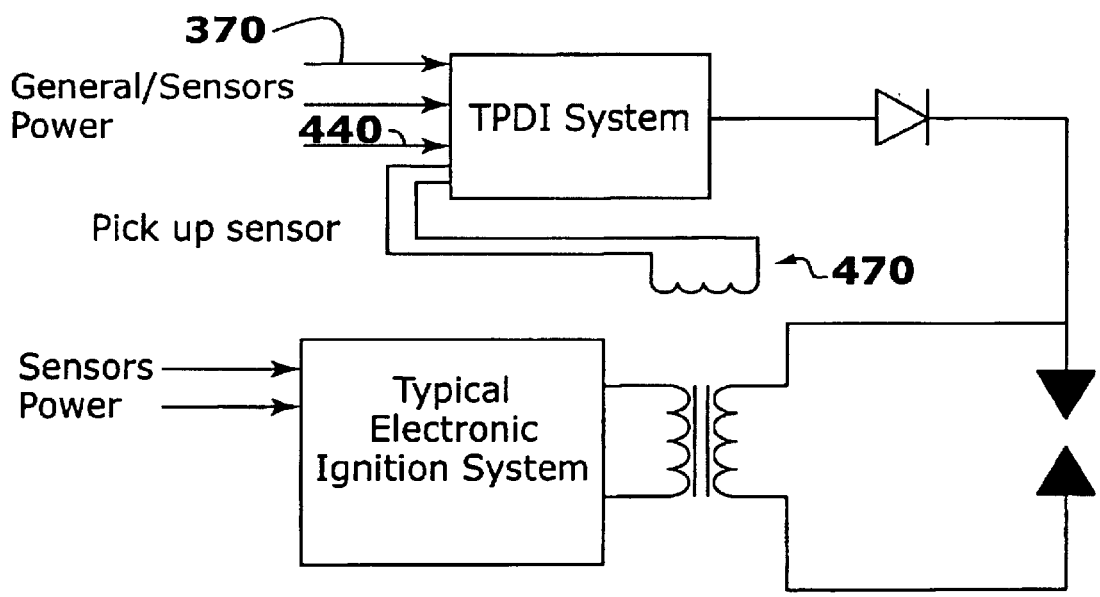

FIG. 4 depicts two embodiments in which the TPDI system is used as an "add on" starter for systems requiring controlled energy delivery for initiation. For example, crank-start IC engines can benefit from TPDI acting in an auxiliary sense (through a diode 460) with the current ignition system 450. External control signals 370 that regulate system ignition may cause the TPDI to operate at the onset of ignition charge. Alternatively, the TPDI may sense the initial inductance voltage of the magneto through a timing sensor 415 (FIG. 4A) or a pickup sensor 470 (FIG. 4B). The TPDI provides the breakdown voltage and/or post-breakdown energy in order to aid startup. In an alternative embodiment, the system is used to deliver timed energy to aircraft ignition systems where compact reliable ignition sources are desirable. In these embodiments, the TPDI system preferably includes an external power source 440, for example, a battery or an alternator supplied by a generator coupled to a rotating shaft.

In some embodiments, such as ignition of nontoxic fuels for rocket motors, charge initiators and pest killers, the timing circuitry omits external feedback sensors. In such cases, the timing circuitry is pre-programmed, tuned, and/or controlled by external control signals 370 (FIG. 3A) to deliver the appropriate breakdown timing and energy. Such controllers may still receive and respond to data from sensors 360.

One of the main disadvantages of prior art devices is the lack of output electrical impedance elements, which results in a lack of control of the output power flow and energy delivered across the spark gap. Tests in our laboratory have concluded that systems lacking output electrical impedance elements provide inconsistent ignition because they do not control the output power flow or energy delivered across the spark gap. Further, if the ionization event is somewhat random, with insufficient energy delivery, then consistent combustion is unachievable. Our experiments have shown that spark generation with insufficient energy will not sustain combustion in a typical IC engine. In the TPDI system, precise control over the transformer output power flow determines the repeatability and efficiency of combustion. The present invention provides precisely timed breakdown and controlled energy delivery post-breakdown. The invention also allows generation of several sparks per cycle in a controllable fashion, depending on the rate. This feature ensures combustion ignition in high reliability applications. Once ionization of a fuel mixture has occurred during breakdown, the remaining discharging energy that determines the flame kernel size and growth rate. The flame growth rate can be directly related to performance and emissions.

Charging the Output Capacitance for Breakdown

Although it may be possible to achieve enough output voltage and energy for ignition using a non-rectified, unconditioned transformer output, as is disclosed in U.S. Pat. No. 5,715,801, we have determined that rectification is necessary to best utilize and condition the output. An exemplary rectification scheme is disclosed in U.S. Pat. No. 4,054,936, where only a capacitor parallel to the breakdown gap is disclosed.

Figure 5:
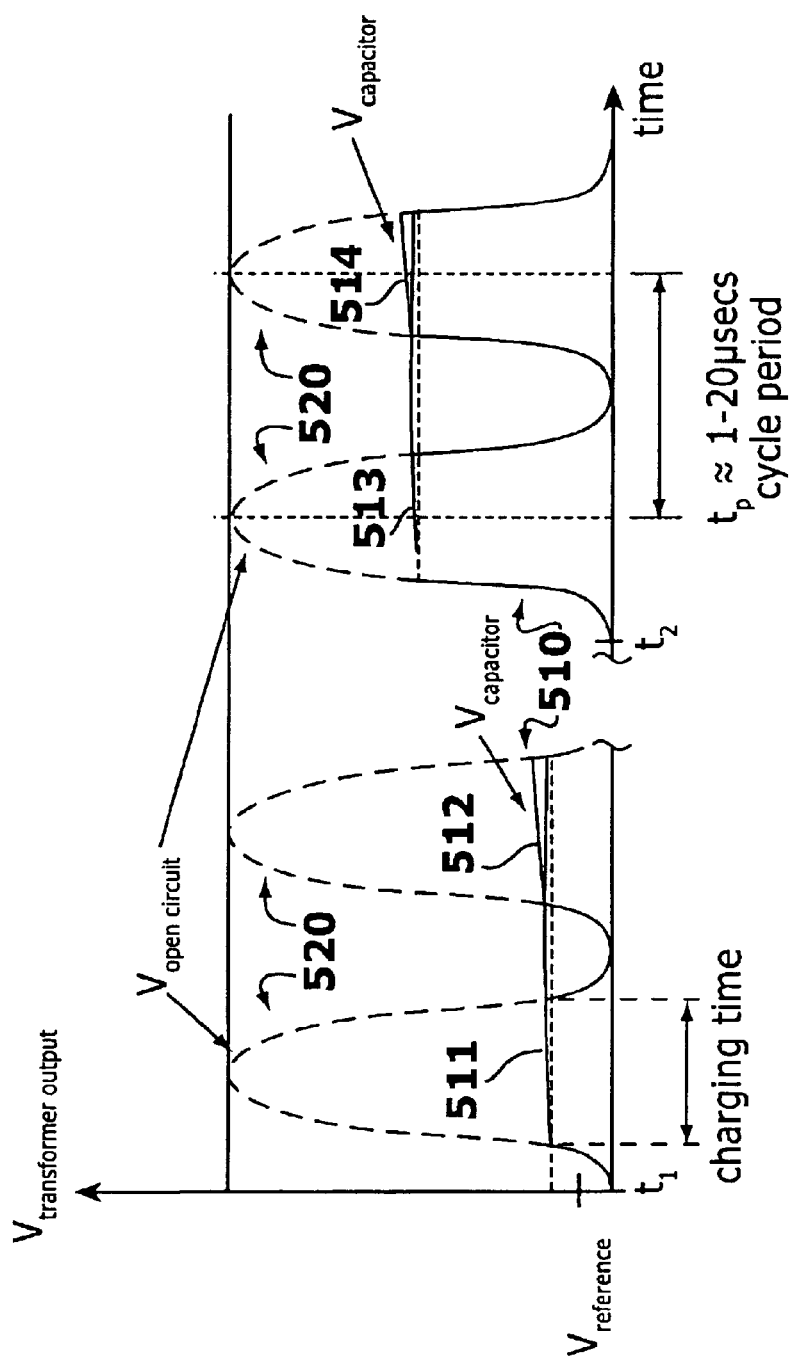
FIG. 5 illustrates a typical transformer output voltage over several transformer response periods, where $t_2$ is some time later than $t_1$ (solid line—transformer charges capacitor through rectifier; dotted line—open circuit across output terminals of transformer).

FIG. 5 shows snapshots of the time history of the output voltage of the transformer after pulse initiation and prior to breakdown. Time point $t_1$ is some short time after the leading edge of a timing pulse that begins the charging. $V_{output}$ 510 is clamped by $V_{capacitor}$ 511, 512 for most of the transformer cycle. $V_{capacitor}$ is incrementally larger than the initial potential, $V_{reference}$, that results from a steady reference level operation of the transformer but is not large enough to induce breakdown. The incremental increase in $V_{capacitor}$ during the charging part of the cycle is determined by the small number of charging cycles since the initiation timing pulse. $V_{reference}$ may be a function of the transformer gain and input voltage level during continuous operation of the transformer at peak output voltage. The output capacitor is thus pre-charged to a level less than the breakdown voltage. To achieve breakdown, the output capacitor only needs to be charged from this non-zero $V_{reference}$ to $V_{breakdown}$, the voltage at which the combustion mixture breaks down, reducing the net charging time.

After some number of cycles, beyond time $t_2$, the charged capacitor voltage 513, 514 rises to some level below breakdown level. The rate at which the capacitor voltage rises during charging is determined by the relationship between the transformer output power capability and the charging capacitor value. As shown in FIG. 5, while the transformer output voltage 510 is below the net voltage on the charged capacitor 511–514 (plus the forward turn-on drop of the rectifier components), the transformer output terminals experience an open circuit condition 520. The output voltage follows the potential curve for operation of the transformer with open circuit output terminals. However, once the rectifier components are forwardly engaged, the voltage level is dictated by a low impedance, or nearly closed, circuit condition. During this part of a cycle, the transformer provides charge packets that increase the voltage on the charging capacitor at a rate that is determined by the ratio of transformer power throughput capability to the charge capacitance.

To provide absolute timing of breakdown, a charge capacitance is selected to make the charge time to breakdown relatively fast and consistent. Typical charge capacitance for small IC applications is on the order of 1–100 pF. IC engines require 30–60 discharging cycles a second, delivering several milliJoules per discharge. In contrast, gas turbine exciters need only deliver 1–2 J of energy twice a second and require roughly 100 nF charging capacitance. The gas turbine application therefore allows longer charging times than IC applications.

For fast charge times, the transformer should also have high power throughput capability. Typically, transformer capacitance is on the order of 10 pF as seen from the output terminals, corresponding to 1–10 W of maximum throughput power at the breakdown voltages required for IC engines. Typically, 10 W of peak throughput power is all that is needed for IC engines. This peak power need only be present over a small duty cycle, say 1–2 ms over a 15–30 ms period. As a result, the transformer is not subject to continuous internal heating during operation.

Higher wattage applications require either higher cross-section transformers or a parallel implementation of several transformers. According to linear theory, modification of cross-section does not effect the transformer operating frequency range because the longitudinal resonance frequencies are independent of the transformer cross-sectional area. However, more cross-sectional area becomes cumbersome in manufacturing when stacking a multi-layered device. When the cross-section becomes too large, spurious off-axis resonances, such as torsion modes, couple into the longitudinal resonance, making it hard to control the power delivery. To counter these problems for applications where the wattage requirement is greater than that provided by typical manufacturing and operating constraints, several transformers can be operated in parallel, as shown in FIG. 3B, with outputs connected to the output charging capacitance after the rectification diodes. FIG. 3B depicts an embodiment of the invention in which three transformers 310A, B, and C are used. Each transformer has its own feedback 311A–C and drive side 312A–C, respectively. Diodes 324A, 324B, 324C, and 323A, 323B, and 323C rectify the current in output conditioning circuit 320. All of the transformers charge a single capacitor 321 that provides a charge to breakdown gap 325.

If the charging capacitor is large compared to the net transformer output capacitance, then the transformer output will be in a low impedance condition, or close to closed circuit. Thus, the transformer is essentially operating for most of each cycle as a device with output voltage clamped by the capacitor voltage level. The particular resonance frequency of desired transformer operation is far from electrically "free."Indeed, similar devices are often described as mechanically free, although this is also a misnomer due to various mounting effects and inefficiencies.

According to linear piezoelectric theory, the difference between the closed circuit to open circuit compliance of a piezoelectric device varies as the piezoelectric constant (known as the "d" constant in the IEEE standard for piezoelectricity) squared over the material dielectric permitivity. Typical values for hard and soft piezoelectric materials are described in U.S. Pat. No. 6,114,797. Soft piezoelectric materials typically have d constants that are six times higher than hard piezoelectrics, while dielectric strengths of soft piezoelectric ceramics are only twice that of hard materials (Berlincourt, et al., "Properties of Morgan Electro Ceramic Ceramics," Morgan Electro Ceramics Technical Publication No. TP-226). Therefore, the resonance range for a transformer constructed of soft piezoelectric material can be as much as 18 times that of the hard material.

The patents and other references described above provide limited speed of feedback and "self oscillation" control over the transformer frequency. However, to charge an output capacitance, "tight," or fast, feedback control and/or feed forward commands are needed to track cycle-by-cycle changes in the resonance.

To increase efficiency, the transformer may be fabricated from a piezoelectric material that exhibits small mechanical resonance frequency shifts as the output electrical terminals range from low to high impedance. Such a device is disclosed in U.S. Pat. No. 5,872,419, the contents of which are incorporated herein by reference. This type of device is currently being made in sample quantities, and we have used this device in some embodiments of the invention. The '419 patent further discloses the use of feedback electroding and circuitry that allow fast tracking of the fast moving resonance. This, combined with the small mechanical compliance changes, makes this device desirable for the TPDI system.

In contrast, a less optimal transformer device is disclosed in U.S. Pat. No. 6,114,797. The '797 patent discloses a central transformer device that combines a soft and hard piezoelectric material to yield a so-called high deformation piezoelectric (HDP) transformer. The difficulty of tracking the resistive, wide band resonance of the soft piezoelectric makes this transformer difficult to use in the current invention embodiments. There are advantages of such a device, such as its high power throughput capability, but these are outweighed for ignition purposes by its low voltage gains.

The typical response period of transformers, denoted $t_p$ in FIG. 5, ranges from 1–20 $\mu$s, depending strongly on the voltage gains or the length of the direction of vibration of the transformer. Twenty microseconds roughly corresponds to 0.4 crank angle degrees at 3000 RPM. As a result, charging may take many crank angle degrees and should be initiated precisely at an accurately measured time prior to the time/angle of desired breakdown. The amount of charging per cycle is directly related to the transformer electrical capacitance as measured between the output terminals.

The design tradeoff of the invention is to employ a high voltage gain transformer, i.e., a longer length transformer, resulting in longer charging periods that require more crank angle degrees of advancement, while simultaneously charging the capacitor 321 with the maximum energy for each cycle to reduce the net advance time needed to attain breakdown. The high voltage gain transformer achieves breakdown with small time uncertainty while increasing net materials costs due to the longer length of material used. To offset the increase in materials costs, the input electronics costs may be lowered because smaller input drive voltages are needed. Alternative sources of gain, such as pre-amplifiers for the transformer, are less controllable, making ignition unreliable. A direct high gain transformer is preferable to precisely time the output.

Figure 6:
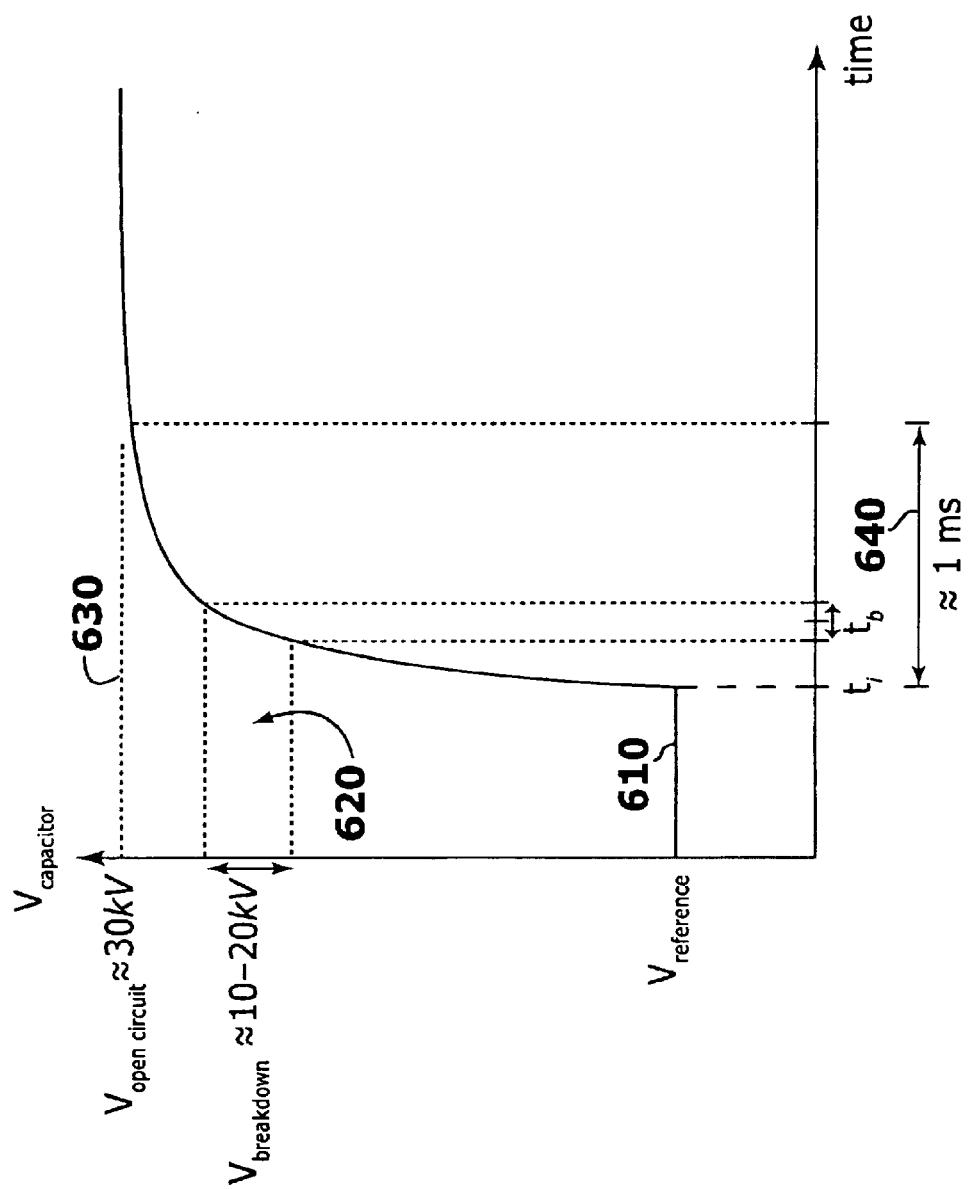
FIG. 6 illustrates the voltage across a charging capacitor during a charging cycle with no gap breakdown (i.e., extremely high breakdown gap impedance).

This trade is illustrated in FIG. 6, which depicts the relatively long-time scale (on the order of milliseconds, or hundreds of cycles) charging of the output capacitor. If there were no breakdown, the capacitor would charge to the open circuit, output capability of the transformer $V_{opencircuit}$. Given the high Q's of these devices, this output voltage can be greater than the ~20 kV needed for consistent breakdown. With a high gain transformer device, enabled by certain choices of transformer construction, such as those disclosed by U.S. Pat. Nos. 5,872,419 and 5,341,061, merely 12 Volts of input excitation is sufficient to attain 20+ kV of output.

Breakdown ionization can occur over a range of voltage levels. FIG. 6 depicts the typical voltage across a charging capacitor both with and without breakdown. Influences such as unburnt hydrocarbon, fouling, and fluctuations in pressurization can lead to different breakdown levels from cycle to cycle. To provide accurate breakdown timing, $t_b$, 640, the output capacitor charging rate between $V_{reference}$ 610 and $V_{breakdown}$ 620 must be very repeatable. One way to accomplish this goal is to ensure that the possible $V_{breakdown}$ range is traversed by a steep part of the charging curve. This ensures that $V_{breakdown}$ is realized with relatively small variation in time from initiation and that the relative time, $t_b$–$t_i$, is repeatable within known noise limits. Within the breakdown voltage range, a breakdown voltage is reached at time $t_b$, sometime after a timing pulse $t_i$ initiates charging. A voltage reference level is shown as a potentially non-zero charge capacitor operating voltage. At elevated reference voltages, the time $t_b$–$t_i$ of charging to breakdown can be reduced significantly. The typical time for reaching a "no breakdown" maximum depends strongly on the charge capacitor value. For example, charging a 40 pF capacitor takes roughly 1–2 ms depending on the transformer design, while charging a 50 nF capacitor takes on the order of 250 ms.

Pre-charging of the output capacitance to $V_{reference}$ 610, a level safely below the breakdown range, can speed the absolute response time $t_b$–$t_i$. This pre-charging takes place before the timing pulse initiates the final charging at $t_i$ and causes the transformer to resonate in a high output impedance operating condition prior to initiation. This places the transformer near the desired condition for optimum charging power flow so that a rapid response occurs when breakdown charging is initiated.

Post Breakdown Control

Figure 7:
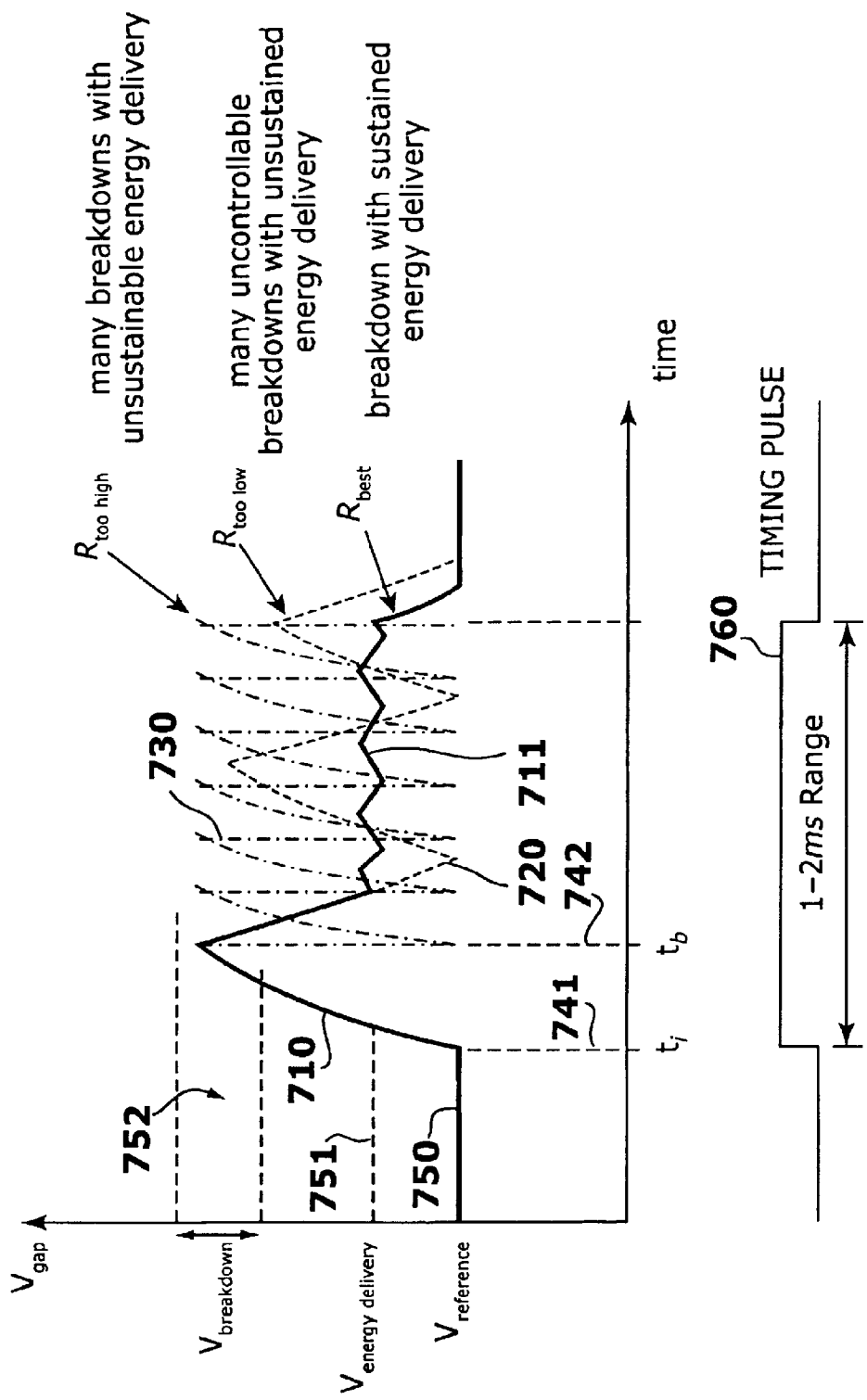
FIG. 7 illustrates the voltage across the output capacitor during breakdown for different values of output series impedance.

The invention also provides a reliable energy delivery profile pre-and post-breakdown, i.e., a controllable discharge voltage profile, including precise timing of breakdown and control of post-breakdown energy delivery. FIG. 7 shows the gap breakdown voltage profile 710 enabled by the current invention. Before breakdown, the rate of charging is independent of the series resistance values. After breakdown, the charged capacitor discharges across the ignition gap is dictated by resistor 322 (FIG. 3).

In order to select the output resistance and capacitance or impedance for desirable post-breakdown operation, the TPDI should be configured so that best power flow, or energy transfer, from transformer output to an electrical load occurs when the potential across the load is approximately one half of the voltage attained when the device operates with open circuit terminals. That a peak power transfer operating point exists is supported by the following argument: At low levels of output impedance, the current is a maximum, but the voltage is a minimum. With high output impedance, the voltage is a maximum but the current is a minimum because only a small part of the high output impedance cycle is spent delivering charge. By inference, there must be an optimum in the midrange of clamped output voltage.

Mathematically the electrical output equation for piezoelectricity can be stated, $$q = C_p * v + C_o * r \quad (1)$$

where q is the charge on the output electrodes, v is the output voltage, $C_p$ is the piezoelectric capacitance, $C_o$ is the piezoelectric electromechanical coupling, and r is the mechanical deformation. For open circuit output conditions, q=0 and $V_{opencircuit} = -C_o/C_p * r$. Current is the time derivative of the above expression for charge production, and this is multiplied by voltage to obtain instantaneous power, $P_{ins}$:

$$P_{ins} = v*d/dt(C_p*v+C_o*r) \tag{2}$$

This is then integrated by parts over a period to attain average, per cycle power, $P_{cyc}$:

$$P_{cyc} \sim B*(C_p*v^2+C_o*r*v) \tag{3}$$

The value of B, a constant, depends on the waveform of the voltage, which one can assume is sinusoidal for the moment. To optimize $P_{cyc}$, the derivative is taken with respect to v and the result set equal to zero, $$2*C_p*v+C_o*r=0 \tag{4}$$

Solving this equation results in the optimum output voltage, $$V_{opt}=-C_o/(2*C_p)*r \tag{5}$$

which is exactly half the open circuit voltage level. The exactness of this result varies with the incorporation of nonlinear electrical components such as diode rectifiers, but we have shown through simulation that the peak power flow occurs near $V_{opt}$.

This optimum function is relatively forgiving, so that the resistance of resistor 322 only has to be in a certain range for a given charging capacitance and transformer power capability for the device to operate near peak post-breakdown power flow efficiency. For example, for a transformer with an output capacitance in the range of 10 pF capable of 10 W of continuous power throughput and an output charging capacitor value in the range of 20 pF, the resistance range is 10–100 kΩ.

Once breakdown has occurred, operating the transformer near the optimum power transfer point results in the desired post-breakdown voltage profile and simultaneously minimizes the overall cost of the device because less piezoelectric material is needed to deliver a given amount of energy to the breakdown gap in a relatively well-defined time.

Typical TPDI post breakdown discharge is shown in FIG. 7. The figure shows that well-conditioned electrical output results in uniform energy delivery voltage levels, which necessarily enables power regulation in the breakdown gap when combined with metered delivery durations. This delivery duration can be of variable absolute time length and is typically in the range of several crank angle degrees (1–2 milliseconds for approximately 300 RPM) for the best small IC engine performance. The series resistance is selected to maintain the post-breakdown voltage during energy delivery at approximately half of $V_{opencircuit}$. If the series resistance is too large for a charging capacitance and transformer power capability, the breakdown is frequent but delivers unsustainable energy 730 across the gap. If the resistance is too low, the discharge achieves large variations 720 due to the rapid unloading of capacitor energy across the gap. If the resistance is properly optimized, the desired power flow and rapid charging to breakdown occurs, resulting in the breakdown profile 710, 711. The post-breakdown discharge voltage 711 drops initially then remains relatively constant near $V_{energydelivery}$ 751 with only small variations. The maintained output voltage level, $V_{energydelivery}$, allows post-breakdown control of the deliverable energy to the spark gap via determination of the length of timing pulse 760, or, correspondingly, provision of a "turn off" pulse.

For a selected charging capacitance and series resistance, the power flow across the spark gap is determined solely by the transformer achievable output power flow at the operating delivery voltage, $V_{energydelivery}$ 731. As the transformer output voltage drops below that of the charging capacitance, which it does on a timescale related to the period of transformer excitation, the charging capacitance maintains charge delivery to the gap. When the transformer output voltage rises to and tries to go beyond the capacitor voltage, the ensuing power flow from the transformer delivers charge across the gap while simultaneously charging the capacitor. The charge from the transformer output is split roughly evenly between the capacitor and the breakdown gap. The split amounts depend on the ratio of the resistive impedance to the capacitor impedance.

The time between the start of the timing pulse and the resulting breakdown should be carefully controlled. In one embodiment, the timing pulse is a switch signal that controls the voltage level, $V_{supply}$, and thus gain, at the amplifier stage 341 on the driven side 312 of the transformer 310. The length of the timing pulse determines the metering of post-breakdown power flow across the spark gap. With well-tuned transformer output impedance, simple timing pulses are sufficient to regulate energy delivery through timing.

The profile 710, 711 enabled by optimum selection of output impedance is shown in FIG. 7. The post-breakdown profile provides sustained energy delivery to the established flame kernel without the need for unreliable and inconsistent re-ionization. The TPDI system provides sustained discharge and delivery of energy to the flame kernel, enabling robust high performance combustion, especially when a fast moving, changing mixture passes through the breakdown zone (Nakai, 1985).

Figure 8:
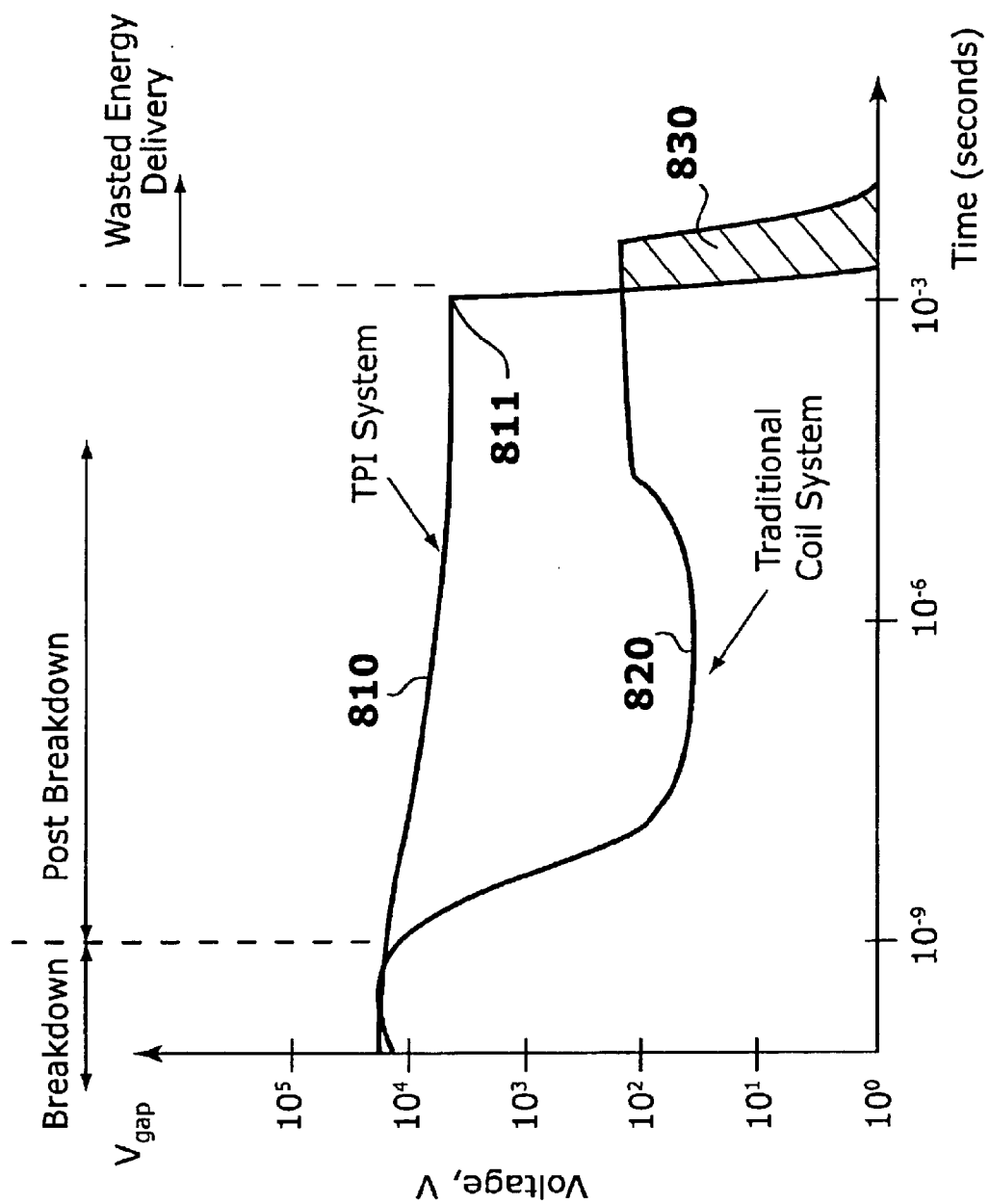
FIG. 8 compares the breakdown and post-breakdown behavior of an ignition system according to an embodiment of the invention and a typical coil system (adapted from Heywood) for an internal combustion engine.

A comparison of the invention discharge voltage to a traditional coil ignition system is shown in FIG. 8. The waveforms are shown as log (gap voltage) versus log (time). The coil system delivers energy early and very late in the cycle, traditionally called the arc and glow discharge phases. Much of this energy, roughly the integrated area under the square of the magnitude of the shown curve, occurs well after the flame front has propagated from the point of breakdown. That is, much of the energy in the sketch is under the long time scale portion of the curve, in the post-millisecond range. In contrast, the TPDI energy is delivered early post-breakdown, yet well before and up to the millisecond range, where an efficient transfer of the energy to the unsteady flame kernel occurs. The traditional system response 820 exhibits rapid voltage attenuation after breakdown and continues to deliver energy at a low voltage well past the TPDI shutoff time 811.

The net energy delivered to the spark gap varies with the square of the voltage integrated over the time the gap is broken down. In the traditional system, the energy is delivered to the gap too late 830 and at low voltages. The traditional system time of delivery is typically considerably longer than that of the TPDI system, on the order of several milliseconds, and at much lower voltages, on the order of 100's of volts. This is due to finite delays in magnetic field collapse in coil-based systems. The TPDI system delivers more energy during the short time post-breakdown, when energy delivery to the flame kernel is efficient (Heywood, 1988), and at higher post-breakdown voltages. Therefore, TPDI enhances performance of the spark ignition while delivering less energy than a coil system because it does not continue to deliver the energy during time periods after the combustion flame kernel has long since departed from the ignition point.

The TPDI system is superior to traditional captive discharge systems (see the Bosch Automotive Handbook) where the spark duration is often insufficient to raise the temperature of the ionized mixture. Captive discharge techniques that utilize a timed discharge of a capacitor on the primary side of a traditional transformer were initially desirable for their solid state timing capabilities. However, they were only introduced into fixed speed, specialized combustion scenarios due to the short duration of discharge (about 10 μs).

Others have appended a low voltage, higher energy charge capacitor system to the secondary side of the ignition system. This alleviates the short duration problem at the expense of system complexity and cost. The disadvantage of the secondary discharge is that it provides too much power over very short time periods. This results in electrode erosion and eventual igniter replacement costs.

Conclusions

In one embodiment of the invention, post-rectifier charge capacitance and output series resistance are selected to provide precise control of breakdown timing and post-breakdown energy delivery. Other series elements, such as inductance, may also be optimized. It is preferred to employ a transformer with high voltage gain and loaded power transfer capability. Accurate timing and precise control of the duration and shape of a timing pulse or pulses will further increase system efficiency.

The resulting TPDI pre- and post-breakdown voltage profile suits the piezoelectric transformers for use in spark ignition and initiator devices. The invention further optimizes the cost of the transformer device, and thus the ignition system, because it is operated near peak throughput power for a given duty cycle, maximizing the energy density performance of the material.

Additional Embodiments of the TPDI System

Figure 9A:
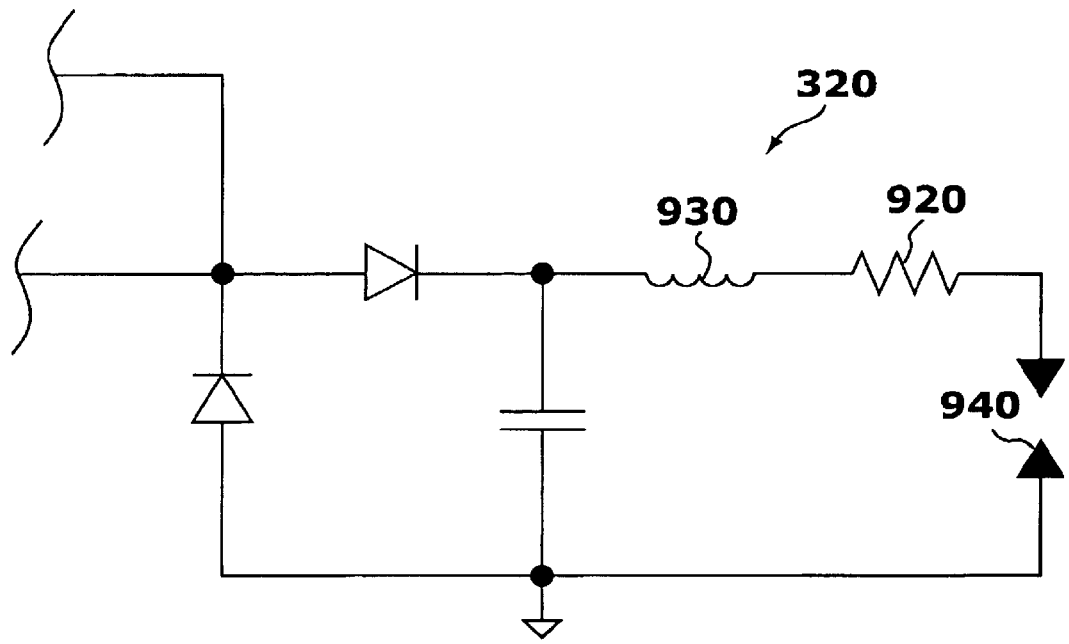
FIG. 9A illustrates an alternative embodiment of the invention in which the series impedance for a transformer output conditioning circuit includes inductance and resistor elements.
Figure 9B:
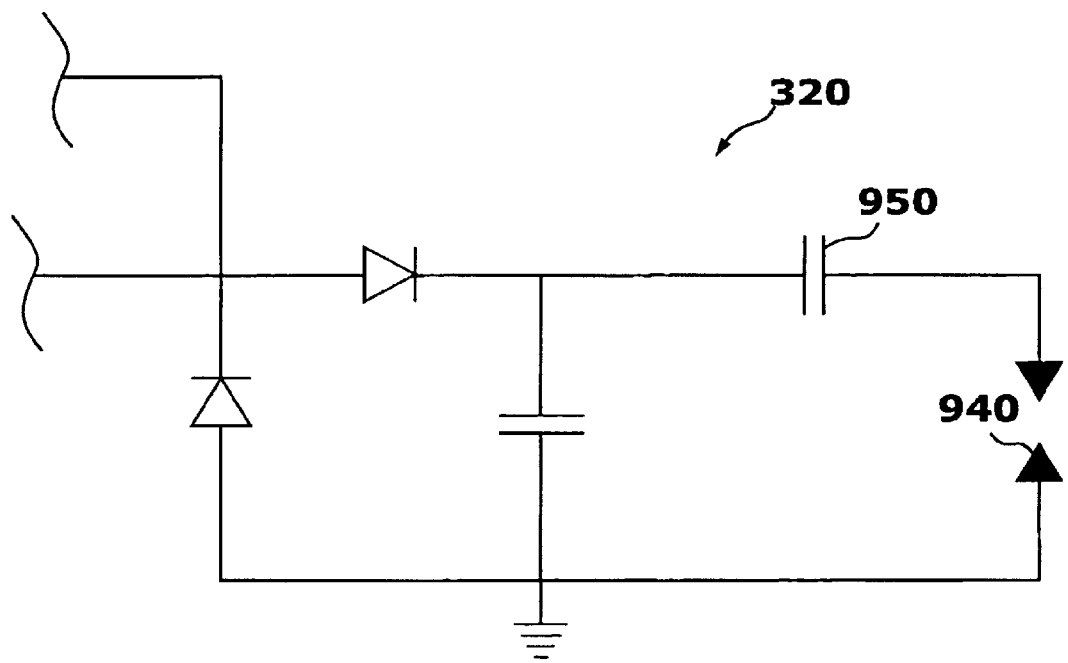
FIG. 9B illustrates an alternative embodiment of the invention in which the series impedance for a transformer output conditioning circuit includes a capacitor.

As shown in FIG. 9A, the output conditioning circuit may include a series inductance element. A small inductor 930 is added as a series element to resistor 920 and spark gap 940. For a 10 W transformer output with discharge capacitance of 20 pF and series resistance of 50 kΩ, the inductance is in the range of 1–10 μH. FIG. 9B illustrates an embodiment of the invention in which capacitance 950 equivalent to the combination of resistor 920 and inductor 930 is placed in the output conditioning circuit. Alternatively, some combination of a capacitor, and inductor, and a resistor may be employed.

Figure 10:
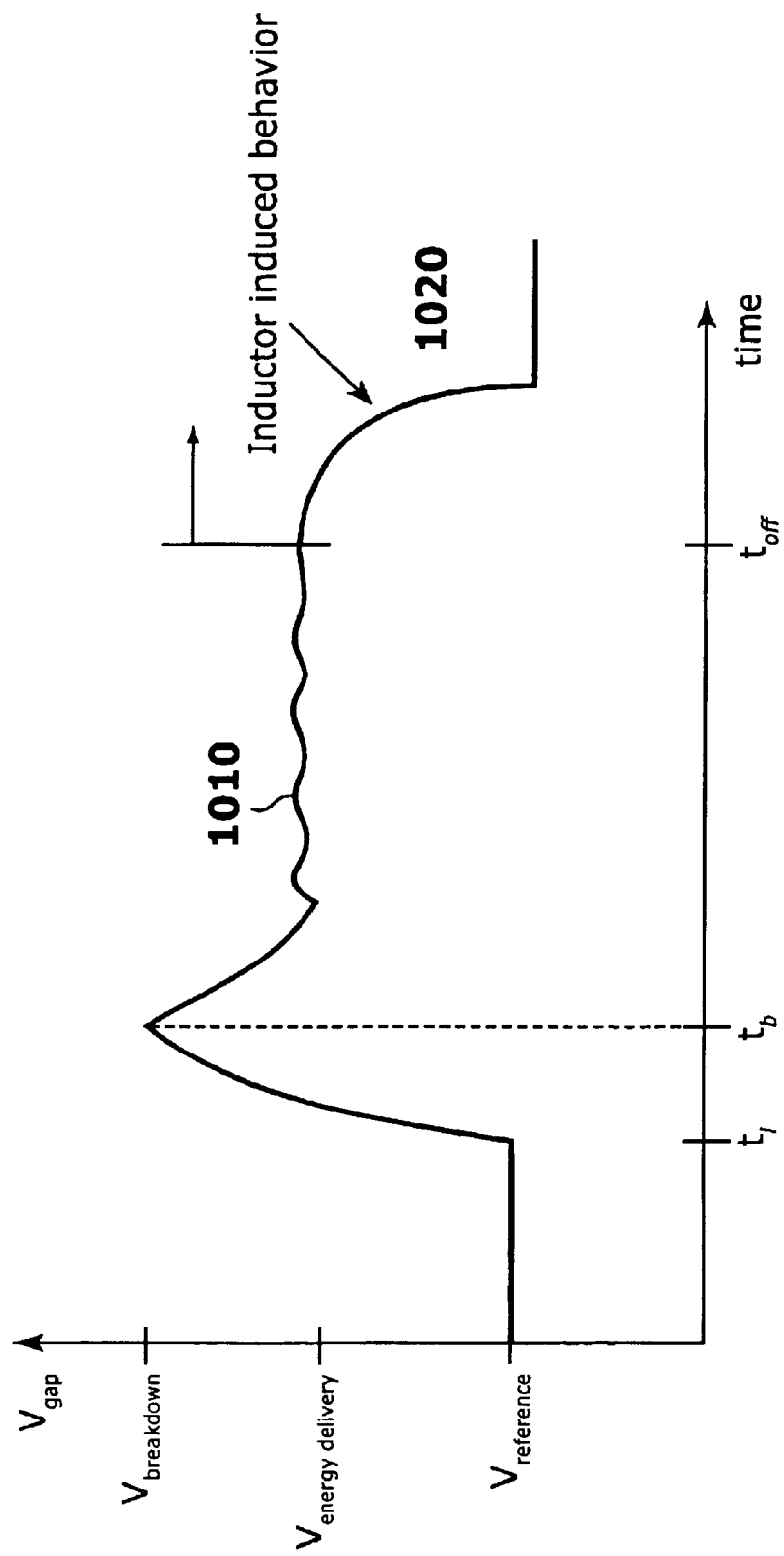
FIG. 10 depicts the resulting change in output waveform, as measured across the breakdown gap, where the inductive element modified the energy discharge profile according to an embodiment of the invention.

The inductor isolates high frequency noise during breakdown (FIG. 10), smoothes the energy delivery post-breakdown 1010 and provides an extra voltage boost 1020. After the timing pulse has turned off, the stored magnetic energy stored in the inductor resists collapsing, forcing the system to continue providing energy for a length of time on the order of 100's of microseconds, as determined by the inductance. The inductive isolation diminishes noise ripples through the charging capacitor due to the discharge event. Timing and feedback circuitry elements are also sensitive to noise and can also benefit from the inclusion of an inductor.

In another embodiment of the invention, the timing circuitry provides feed forward signals 351 to the oscillator while simultaneously controlling 350 the maximum voltage gain of the amplifier stage. These feed forward signals take the form of pulse trains, that, for example, directly drive power MOSFETs, or sinusoidal waveforms that drive amplifiers (linear or switching), depending on the point of control of the transformer. A tuned oscillation may be required to compensate for the rapidly varying output impedance that the transformer sees during typical charging cycles. Furthermore, feed forward commands from the timing circuitry may be used at the same time or independently to control 352 the feedback or self-oscillation circuitry, for example, by regulating the feedback gain through voltage-controlled resistors, thyristors, or the like.

Either analog or digital circuitry may be employed to control the transformer according to the techniques of the invention. The feedback, feed forward, and timing circuitry may all be performed in a single integrated circuit or programmable controller chip. Programmable controller chips are commercially available, and one skilled in the art will be able to design an integrated circuit that incorporates the controllers of the invention. Both external sensors 370 and the transformer sensed output 311, 313 are sensed by the microprocessor or IC and appropriate commands are made to the oscillator amplifier circuits. An IC or microprocessor may be preferred in applications where the TPDI is used as an "add-on" to another system. Analog circuitry is frequently easier to assemble and may be more cost efficient in applications where the TPDI is used as a stand-alone device.

Figure 11A:
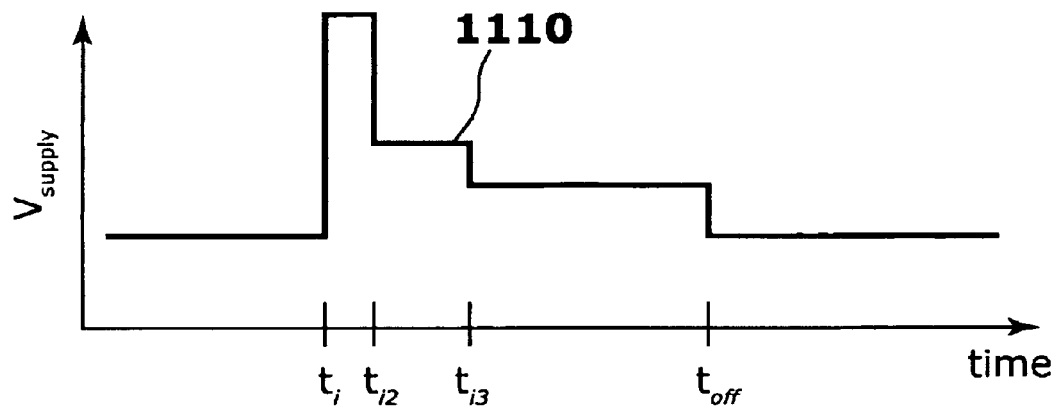
FIG. 11A illustrates timing pulse control of the supply voltage to the transformer drive electronics.
Figure 11B:
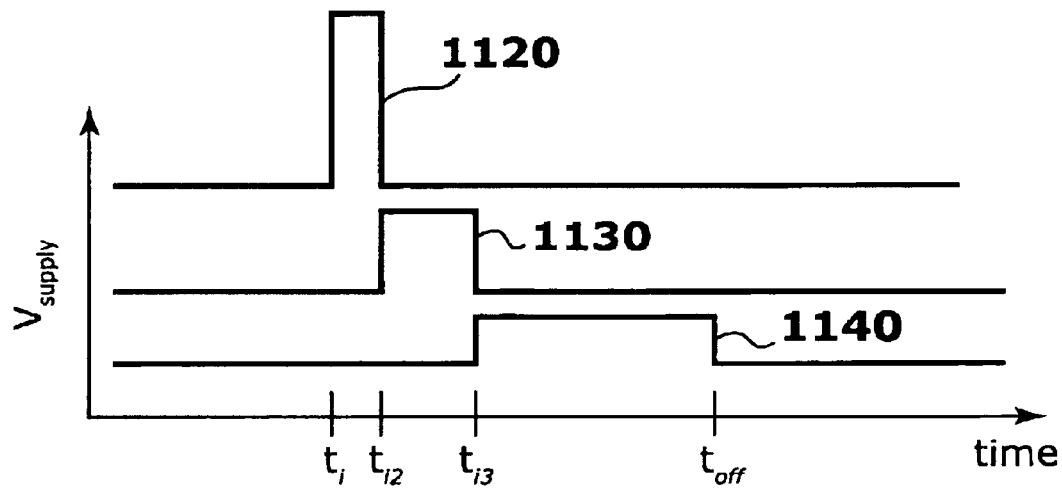
FIG. 11B illustrates a parallel series of pulses for controlling individual electrical supply voltages to the transformer drive electronics.

FIGS. 11A and 11B show how the simple timing pulse 760 shown in FIG. 7 may be adjusted to allow multiple input voltage level control to the transformer. Either a single control pulse (1110), or a separate set of pulses (1120, 1130, 1140) may be used to control separate supply voltage levels that can be combined (via power diodes) together to form the general supply rail.

In another embodiment of the invention, the central transformer is driven in oscillation about a biased electric field. The driving voltage acting on the input side of the transformer is biased and controlled to fluctuate about a constant voltage level. The device then operates about a minimum material hysteresis point. The material hysteresis is a function of oscillation amplitude and field bias. Reduced hysteresis results in higher material Q and thus larger gains. At this operation point, the effective piezoelectric constant can also be as much as 10–20% lower. This yields an operating frequency shift of up to 40% less than in a typical device operating around a zero bias field. Smaller operating frequency shifts result in smaller cycle by cycle variations in resonant frequency and tighter control of absolute timing of the TPDI system.

One skilled in the art will recognize that a variety of transformer configurations, including those discussed above, may be employed with the invention. However, the material must be cut and electroded appropriately (Park, et al., "Characteristics of Relaxor-Based Piezoelectric Single Crystals for Ultrasonic Transducers," IEEE Transactions on Ultrasonics, Ferroelectrics, and Frequency Control, 44(5), 1140–1147, 1997, the entire contents of which are incorporated herein by reference. Table III lists measured material properties). With appropriate shape orientation relative to the crystal and appropriate electroding, the devices can be constructed and operated with or without feedback electroding incorporated into the device.

In another embodiment of the invention, a single crystal piezoelectric material is used to manufacture the central transformer element. Single crystal piezoelectric materials are typically known as "relaxor based single piezoelectric single crystals" and have the general formula $Pb(B_1,B_2)O_3$ where exemplary $B_1$=Zn, Mg, Sc, or Ni, and, exemplary $B_2$=Nb, Ta, Pt, Fe, Bi, Rh, or Ir. (Park, 1997). These single crystals are also fabricated as solid solutions with lead titanate. As a device, a transformer can be thought of as an input stage (the excitation side) and output stage (the side delivering the electrical power). Single crystal piezoelectric material construction benefits both the input and output stages, as described in a U.S. patent application filed on even date herewith, entitled Single Crystal Piezoelectric Transformer, by Brett Masters and Brian MacLachlan, the entire contents of which are incorporated herein by reference.

On the input side, experiments with single crystal material samples have shown them to exhibit three times the typical polycrystalline piezoelectric strains for equivalent electric field levels. The material modulus is on the order of 5 to 6 times less than for typical soft materials, resulting in roughly twice the energy density for the same field levels. However, under certain conditions, single crystal material may be driven at much higher fields, resulting in higher net energy throughput for a given package size. The material dielectric hysteresis is low, permitting the material to be driven hard at ultrasonic frequencies (Park, 1997) and without generating as much internal heat, which can be deleterious to transformer performance due to electrical loading. The mechanical hysteresis is moderate, as is typical of most soft polycrystalline compositions.

On the output stage of the transformer device, the single crystal material has a high value of $d^2/\epsilon$, the piezoelectric constant squared over material electric field permitivity. This value can be an order of magnitude more than typical polycrystalline values. Thus, while the input energy density is only twice that of typical constructions, it must be weighted by the achievable power delivery (ten times typical), since the device is being driven at resonance during operation.

We have tested several geometries of single crystal transformer using tuned, uncontrolled resonant drive electronics. Typical sample sizes were on the order of 0.5 mm thick by 4 mm wide by 8 mm long (longitudinal resonant mode actuated). Voltage gains of near 60 were measured (100's to 1000's are possible with geometric redesign). However, voltage gains of this order are also easily achievable with polycrystalline designs. The main result is a measured power density upwards of 110 Watts/cm$^3$ (1.8 kW/in$^3$). This is 5 to 10 times that of polycrystalline constructions. Typical polycrystalline samples cannot support the current that the single crystal materials can deliver.

For ignition, a high output stage conversion efficiency results in a large range of cycle-by-cycle variation in transformer "resonance" behavior that should be tracked during charging and discharging events. The single crystal transformer thus requires fast feedback circuitry at bandwidths much higher than the transformer operational frequency range, appropriate feed forward commands, or both.

Results

Tests to date have been performed on a single cylinder of a Honda ES6500, a two-cylinder, 4 stroke generator. In these experiments, a multi-layer transformer with isolated output feedback was used. Open circuit voltages in excess of 20 kV were achieved with this transformer. The transformer is capable of a maximum of 7 W of throughput power. The transformer output was rectified through fast acting diodes. The parallel capacitance used was 20 pF and the series resistance was roughly 50 k$\Omega$. Using these parameters, the TPDI system achieved roughly 250 microseconds charging to breakdown and 1–2 milliseconds of continuous energy delivery to the spark gap at a desired energy delivery voltage.

A TPDI system tuned specifically for the application started the single cylinder of the two-cylinder Honda engine reliably, whereas the coil ignition system struggled and provided unreliable startup. The coil failed to provide the ignition energy needed to ignite the choked mixture. Measured RPM data reveals that startup transients for the TPDI were comparable to the coil ignition system for governed RPM and load dependent RPM settings. Measured RPM data taken with various output loading on the generator, for both governed RPM and load dependent RPM settings, showed performance comparable to the coil ignition system. Inspection of the spark plugs after several days of operation showed the TPDI system enabled cleaner burning at higher plug temperatures.

A TPDI system has been run in air from a 9 Volt alkaline battery source, providing roughly 0.3 amp-hours of operation. Based on limited life tests, 10000–20000 multi-cycle starts are possible off one battery, or 100 hours of continuous operation of a single cylinder IC engine at 4000 RPM.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. An ignition system, comprising:
   a piezoelectric transformer having a drive side, an output side, and a piezoelectric element;
   circuit elements in electronic communication with the output side that tune output impedance in series with a breakdown gap to optimize power flow from the transformer to the breakdown gap after breakdown;
   a timing control circuit in electronic communication with the drive side that meters post-breakdown energy delivered to the breakdown gap by timing the duration of post-breakdown power flow; and
   a control circuit selected from the group consisting of electronic feedback control, feed forward control, and both, wherein the control circuit optimizes output performance as the resonance condition of the transformer changes.

2. The ignition system of claim 1, wherein the electronic feedback control receives a signal from the piezoelectric element, the output side, or both.

3. The ignition system of claim 1, wherein the timing control and the control circuit are combined in an integrated circuit.

4. The ignition system of claim 1, wherein the piezoelectric transformer is selected from the group consisting of multi-layer Rosen type and multi-layer thickness-extensional mode type.

5. The ignition system of claim 1, further comprising sensor inputs that provide data for the timing circuit to determine the absolute timing and length of a timing pulse, wherein the timing pulse and the tuned impedance determine the net energy and power delivery to the breakdown gap post-breakdown.

6. The ignition system of claim 4, wherein the sensor inputs measure at least one measurement selected from the group consisting of output voltage, output power delivered, revolutions per minute, torque load, throttle position, at least one chemical species selected from oxygen, carbon monoxide, and carbon dioxide, pressure, intake temperature, exhaust temperature, exhaust composition, intake composition, fuel consumption, humidity, catalytic converter temperature, cylinder wall temperature, a temperature distribution across a turbine blade, spark discharge current, combustion performance, drive side voltage, and external control computer outputs.

7. The ignition system of claim 1, wherein the ignition system is used in addition to a pre-existing ignition system to optimize breakdown timing and post-breakdown energy delivery during predetermined operating conditions.

8. The ignition system of claim 7, wherein the ignition system of claim 7 is used during startup.

9. The ignition system of claim 7, wherein the pre-existing ignition system breaks down the breakdown gap and the ignition system of claim 7 regulates the post-breakdown energy discharge.

10. The ignition system of claim 1, wherein the circuit elements comprise an element selected from the group consisting of at least one resistor, at least one inductor, at least one capacitor, and any combination of the above.

11. The ignition system of claim 1, wherein the timing control circuit provides an output signal to at least one of a transformer drive side amplifier, an oscillation generator in electronic communication with the drive side, and the feedback control.

12. The ignition system of claim 11, wherein the output signal is generated in response to parameters measured during operation of the ignition system.

13. The ignition system of claim 12, wherein the parameters are selected from the group consisting of output power delivered, revolutions per minute, torque load, throttle position, at least one chemical species selected from oxygen, carbon monoxide, and carbon dioxide, pressure, intake temperature, exhaust temperature, exhaust composition, intake composition, fuel consumption, humidity, catalytic converter temperature, cylinder wall temperature, a temperature distribution across a turbine blade, spark discharge current, combustion performance, drive side voltage, and external control computer outputs.

14. The ignition system of claim 12, wherein the timing control circuit compares the parameters to a predetermined reference value.

15. The ignition system of claim 12, wherein the output signal is a function of a plurality of measurements of the parameters.

16. The ignition system of claim 11, wherein the output signal is generated independently of parameters measured during operation of the ignition system.

17. The ignition system of claim 1, wherein the timing control circuit generates an output signal in a form selected from general waveform pulse having multiple control levels, a series of relatively timed single control level pulses, and both.

18. The ignition system of claim 1, wherein the transformer drive electronics operate around a bias voltage in order to lower cycle by cycle resonant frequency variations and minimize material hysteresis.

19. The ignition system of claim 1, wherein the piezoelectric element is a single crystal material.

20. The ignition system of claim 1, further comprising a plurality of piezoelectric transformers, each having output rectification diodes that are adapted and constructed to be in electrical communication with a single capacitor that provides a charge to the breakdown gap.

21. A device having a combustion engine having an igniter, the igniter comprising:

a primary ignition system comprising a power source and a capacitor that is charged by the power source;

a secondary ignition system comprising the ignition system according to claim 1, wherein the capacitor of the primary ignition system is in parallel electronic communication with the breakdown gap.

22. The device according to claim 21, wherein the secondary ignition system provides power to the breakdown gap during predetermined operating conditions.

23. The device according to claim 22, wherein the secondary ignition system provides power to the breakdown gap during device start-up.

24. The device according to claim 22, wherein the primary ignition system breaks down the breakdown gap and the secondary ignition system regulates post-breakdown energy discharge.

25. An ignition system, comprising:

a piezoelectric transformer having a drive side, an output side, and a piezoelectric element;

means for tuning an output impedance of the transformer in series with a breakdown gap to optimize power flow from the transformer to the breakdown gap after breakdown;

means for metering post-breakdown energy delivered to the breakdown gap; and means for optimizing output performance of the transformer as a resonance condition of the transformer changes.

26. The ignition system of claim 25, wherein the means for tuning comprise an element selected from the group consisting of a resistor, an inductor, a capacitor, and any combination of these, wherein the element is in series electronic communication with the breakdown gap.

27. The ignition system of claim 25, wherein the means for optimizing comprise a control system selected from the group consisting of electronic feedback control, feed forward control, and both, wherein the control system responds to an impedance in series electronic communication with the output side of the transformer.

28. The ignition system of claim 25, wherein the means for optimizing comprise an electronic feedback control that receives a signal from the piezoelectric element.

* * * * *